(12) United States Patent
Karimi et al.

(10) Patent No.: US 9,490,845 B2
(45) Date of Patent: Nov. 8, 2016

(54) CODE DESIGN AND HIGH-THROUGHPUT DECODER ARCHITECTURE FOR LAYERED DECODING OF A LOW-DENSITY PARITY-CHECK CODE

(71) Applicant: Infinera Corporation, Sunnyvale, CA (US)

(72) Inventors: Mehdi Karimi, Ottawa (CA); Han Sun, Ottawa (CA); Yuejian Wu, Woodlawn (CA); Scott G. Pringle, Woodlawn (CA); Sandy Thomson, Ottawa (CA)

(73) Assignee: Infinera Corporation, Sunnyvale, CA (US)

( * ) Notice: Subject to any disclaimer, the term of this patent is extended or adjusted under 35 U.S.C. 154(b) by 14 days.

(21) Appl. No.: 14/323,635

(22) Filed: Jul. 3, 2014

(65) Prior Publication Data

US 2015/0311919 A1    Oct. 29, 2015

Related U.S. Application Data

(60) Provisional application No. 61/984,521, filed on Apr. 25, 2014.

(51) Int. Cl.
*H03M 13/00* (2006.01)
*H03M 13/11* (2006.01)
*H04L 1/00* (2006.01)

(52) U.S. Cl.
CPC ....... *H03M 13/1128* (2013.01); *H03M 13/114* (2013.01); *H03M 13/1134* (2013.01); *H04L 1/0051* (2013.01)

(58) Field of Classification Search
CPC ......... H03M 13/1128; H03M 13/114; H03M 13/1134; H03M 13/033; H03M 13/1102; H03M 13/1137; H03M 13/116; H03M 13/1185; H03M 13/1188; H03M 13/618; H03M 13/6362; H03M 13/6393; H03M 13/6502; H03M 13/6516; H03M 13/6527; H04L 1/0051; H04L 1/005
See application file for complete search history.

(56) References Cited

U.S. PATENT DOCUMENTS

| 2009/0183047 A1* | 7/2009 | Lampe | H03M 13/033 |
| | | | 714/752 |
| 2010/0037121 A1* | 2/2010 | Jin | H03M 13/1117 |
| | | | 714/763 |

(Continued)

OTHER PUBLICATIONS

Daniel J. Costello, Jr. et al., "A Comparison Between LDPC Block and Convolutional Codes", In Proceedings of Information Theory and Applications Workshop, http://ita.ucsd.edu/workshop/06/papers/253.pdf, Feb. 6-10, 2006, 5 pages.

(Continued)

*Primary Examiner* — Guerrier Merant
(74) *Attorney, Agent, or Firm* — Harrity & Harrity LLP; David L. Soltz

(57) ABSTRACT

A low-density parity-check (LDPC) decoder may receive LDPC coded data. The LDPC decoder may perform a decoding iteration associated with decoding the LDPC coded data. The decoding iteration may be performed by processing a group of layers. Each layer may include a corresponding set of check node elements, and may be processed by causing each check node element, of the set of check node elements corresponding to the layer, to update a set of variable node elements, connected to the check node element and associated with the LDPC coded data, based on a check node function associated with the check node element. The decoding iteration may be performed such that each layer is processed in parallel, and such that each check node element updates the corresponding set of variable node elements in parallel. The LDPC decoder may provide a result of performing the decoding iteration.

11 Claims, 16 Drawing Sheets

(56) References Cited

U.S. PATENT DOCUMENTS

| | | | | |
|---|---|---|---|---|
| 2010/0281330 | A1* | 11/2010 | Blanksby | H03M 13/033 714/752 |
| 2013/0246894 | A1* | 9/2013 | Declercq | H03M 13/256 714/792 |
| 2014/0101510 | A1* | 4/2014 | Wang | H03M 13/09 714/758 |

OTHER PUBLICATIONS

Chiu-Wing Sham et al., "A 2.0 Gb/s Throughput Decoder for QC-LDPC Convolutional Codes", IEEE Transactions on Circuits and Systems I: Regular Papers, vol. 60, Issue 7, May 1, 2013, 12 pages.

Ali E. Pusane et al., "Deriving Good LDPC Convolutional Codes from LDPC Block Codes", IEEE Transactions on Information Theory, vol. 57, Issue 2, Dec. 1, 2010, 21 pages.

Ali E. Pusane et al., "Implementation Aspects of LDPC Convolutional Codes", IEEE Transactions on Communications, vol. 56, No. 7, Jul. 2008, 11 pages.

Massachusetts Institute of Technology, "Lecture 8 Convolutional Coding", http://web.mit.edu/6.02/www/s2010/handouts/lectures/L8-notes.pdf, Oct. 4, 2010, 8 pages.

Massachusetts Institutue of Technology, "Lecture 9 Viterbi Decoding of Convolutional Codes", http://web.mit.edu/6.02/www/f2010/handouts/lectures/L9.pdf Oct. 6, 2010, 11 pages.

Bernhard M.J. Leiner, "LDPC Codes—a brief Tutorial", http://www.bernh.net/media/download/papers/ldpc.pdf, Apr. 8, 2005, 9 pages.

R. Michael Tanner et al., "LDPC Block and Convolutional Codes Based on Circulant Matrices", IEEE Transactions on Information Theory, vol. 50, No. 12, Dec. 2004.

* cited by examiner

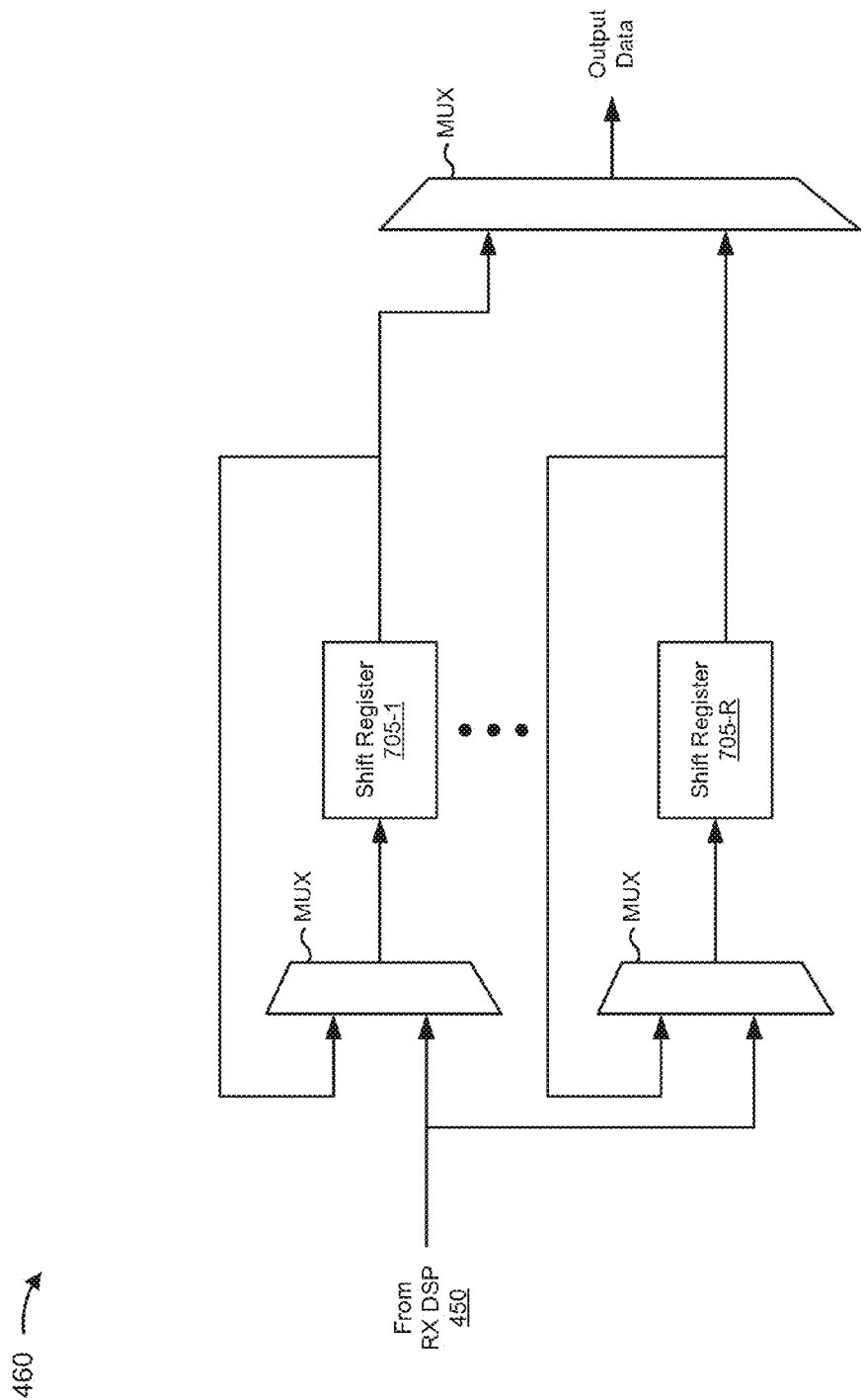

4 x 8 Permutation Matrix (Sub-Matrix 1)
(200,4,8) Regular LDPC Convolutional Code

| | V1 | V2 | V3 | V4 | V5 | V6 | V7 | V8 |
|---|---|---|---|---|---|---|---|---|
| C1 | 0 | 196 | 2 | 182 | 183 | 23 | 164 | 101 |
| C2 | 178 | 6 | 189 | 2 | 7 | 135 | 2 | 0 |
| | ⇨ | ⇨ | ⇨ | ⇨ | ⇨ | ⇨ | ⇨ | ⇨ |
| Smallest Absolute Difference: | 178 | 190 | 187 | 180 | 176 | 112 | 162 | 101 |

⇨ Parallelization Factor = 101 (LDPC Convolutional Code Sub-matrix 1 can be parallelized by a factor of 100, or 50 check nodes per layer)

4 x 8 Permutation Matrix (Sub-Matrix 2)
(200,4,8) Regular LDPC Convolutional Code

| | V1 | V2 | V3 | V4 | V5 | V6 | V7 | V8 |
|---|---|---|---|---|---|---|---|---|
| C3 | 91 | 103 | 76 | 2 | 0 | 195 | 83 | 170 |
| C4 | 192 | 1 | 192 | 104 | 103 | 92 | 198 | 0 |
| | ⇨ | ⇨ | ⇨ | ⇨ | ⇨ | ⇨ | ⇨ | ⇨ |
| Smallest Absolute Difference: | 101 | 102 | 116 | 102 | 103 | 103 | 115 | 170 |

⇨ Parallelization Factor = 101 (LDPC Convolutional Code Sub-matrix 2 can be parallelized by a factor of 100, or 50 check nodes per layer)

CODE DESIGN AND HIGH-THROUGHPUT DECODER ARCHITECTURE FOR LAYERED DECODING OF A LOW-DENSITY PARITY-CHECK CODE

RELATED APPLICATION

This application claims priority under 35 U.S.C. §119 to U.S. Provisional Patent Application No. 61/984,521, filed on Apr. 25, 2014, the content of which is incorporated by reference herein in its entirety.

BACKGROUND

A low-density parity-check (LDPC) code is a linear error correcting code with a sparse parity-check matrix and a block length that may attain performance near the Shannon limit. The LDPC code may be constructed using a sparse bipartite graph. In some implementations, the LDPC code may be decoded using an iterative algorithm, such as a message passing algorithm, that allows information to be passed between storage elements and check node elements associated with decoding the LDPC coded data.

SUMMARY

According to some possible implementations, a receiver may comprise a low-density parity-check (LDPC) decoder configured to: receive LDPC coded data; perform a decoding iteration associated with decoding the LDPC coded data, where the decoding iteration may be performed by processing a group of layers associated with decoding the LDPC coded data, where each layer, of the group of layers, may include a corresponding set of check node elements, and where each layer may be processed by causing each check node element, of the set of check node elements corresponding to the layer, to update a set of variable node elements, connected to the check node element and associated with the LDPC coded data, based on a check node function associated with the check node element, where the decoding iteration may be performed such that each layer, of the group of layers, is processed in parallel, and where the decoding iteration may be performed such that each check node element, included in each set of check node elements corresponding to each layer, updates the corresponding set of variable node elements in parallel; and provide a result of performing the decoding iteration associated with decoding the LDPC coded data.

According to some possible implementations, a computing device may comprise one or more processors configured to: receive information that identifies a design threshold associated with a low-density parity-check (LDPC) code; determine information associated with a permutation matrix for the LDPC code, where the permutation matrix may include a group of rows, where each row, of the group of rows, may correspond to a check node element of a group of check node elements associated with the LDPC code, where the permutation matrix may include a group of columns, where each column, of the group of columns, may correspond to a variable node element of a group of variable node elements associated with the LDPC code, and where the permutation matrix may include a set of values, where each value, of the set of values, may correspond to a particular check node element, of the group of check node elements, and a particular variable node element of the group of variable node elements, and where each value, of the set of values, may identify a connection between the particular check node element and the particular variable node element; compute a parallelization factor associated with the permutation matrix, where the parallelization factor being computed based on the set of values included in the permutation matrix; determine, based on the parallelization factor, whether the permutation matrix satisfies the design threshold; and provide information indicating whether the permutation matrix satisfies the design threshold.

According to some possible implementations, a method may comprise: determining, by a device, information that identifies a design threshold associated with a low-density parity-check (LDPC) code; receiving, by the device, information associated with a permutation matrix associated with designing the LDPC code, where the permutation matrix may include a group of rows, where each row, of the group of rows, may correspond to a processing element of a group of processing elements associated with the LDPC code, where the permutation matrix may include a group of columns, where each column, of the group of columns, may correspond to a storage element of a group of storage elements associated with the LDPC code, and where the permutation matrix including a set of values, where each value, of the set of values, may correspond to a particular processing element, of the group of processing elements, and a particular storage element of the group of storage elements, and where each value, of the set of values, may identify a connection between the particular processing element and the particular storage element; determining, by the device, a parallelization factor associated with the permutation matrix, where the parallelization factor may be computed based on the set of values included in the permutation matrix; identifying, by the device and based on the parallelization factor, whether the permutation matrix satisfies the design threshold; and providing, by the device, information indicating whether the permutation matrix satisfies the design threshold.

BRIEF DESCRIPTION OF THE DRAWINGS

FIGS. 7A and 7B are diagrams of example components of an LDPC decoder shown in FIG. 4;

FIGS. 11A and 11B are diagrams of an example permutation matrix, associated with an LDPC code, that does not allow an LDPC decoder to implement a fully parallel layered decoder architecture, but does allow the LDPC decoder to implement a partially parallel layered decoder architecture;

DETAILED DESCRIPTION

The following detailed description of example implementations refers to the accompanying drawings. The same reference numbers in different drawings may identify the same or similar elements. Additionally, while the systems and/or methods described herein are described in the example context of an optical communication network, these systems and/or methods may be equally applied in another context, such as a wireless communication network, a telecommunication network, or another type of communication network.

The demand for a higher data throughput and/or a lower bit error rate (BER) within a communication system (e.g., an optical communication system) is increasing. A low-density parity-check (LDPC) code decoded using an iterative message passing decoding algorithm is one candidate to reach a low BER and/or a low error floor when decoding LDPC coded data. However, designing a high throughput LDPC decoder may be difficult due to the complexity of the iterative message decoding algorithm and/or due to the complexity of routing networks associated with the LDPC decoder.

Layered decoding is a technique that may be implemented to reduce the number of iterations required to decode LDPC coded data (e.g., with a result of increasing data throughput). In a traditional layered decoder, layers may be processed sequentially (e.g., a first layer is completely processed, followed by a second layer, etc.). However, this may lead to a large decoding latency per iteration (e.g., since each layer needs information updated by previous layers).

Implementations described herein may allow an LDPC code to be designed such that an LDPC decoder may implement a fully parallel layered decoder architecture that allows all layers, associated with decoding iterations of LDPC coded data, to be processed in parallel, and all check node elements, within each layer, to operate in parallel. This may allow the LDPC decoder to decode LDPC coded data with high data throughput (e.g., a low decoding latency), while requiring less memory storage per iteration, and with a simplified routing network (e.g., as compared to a traditional LDPC decoder architecture).

Figure 1:
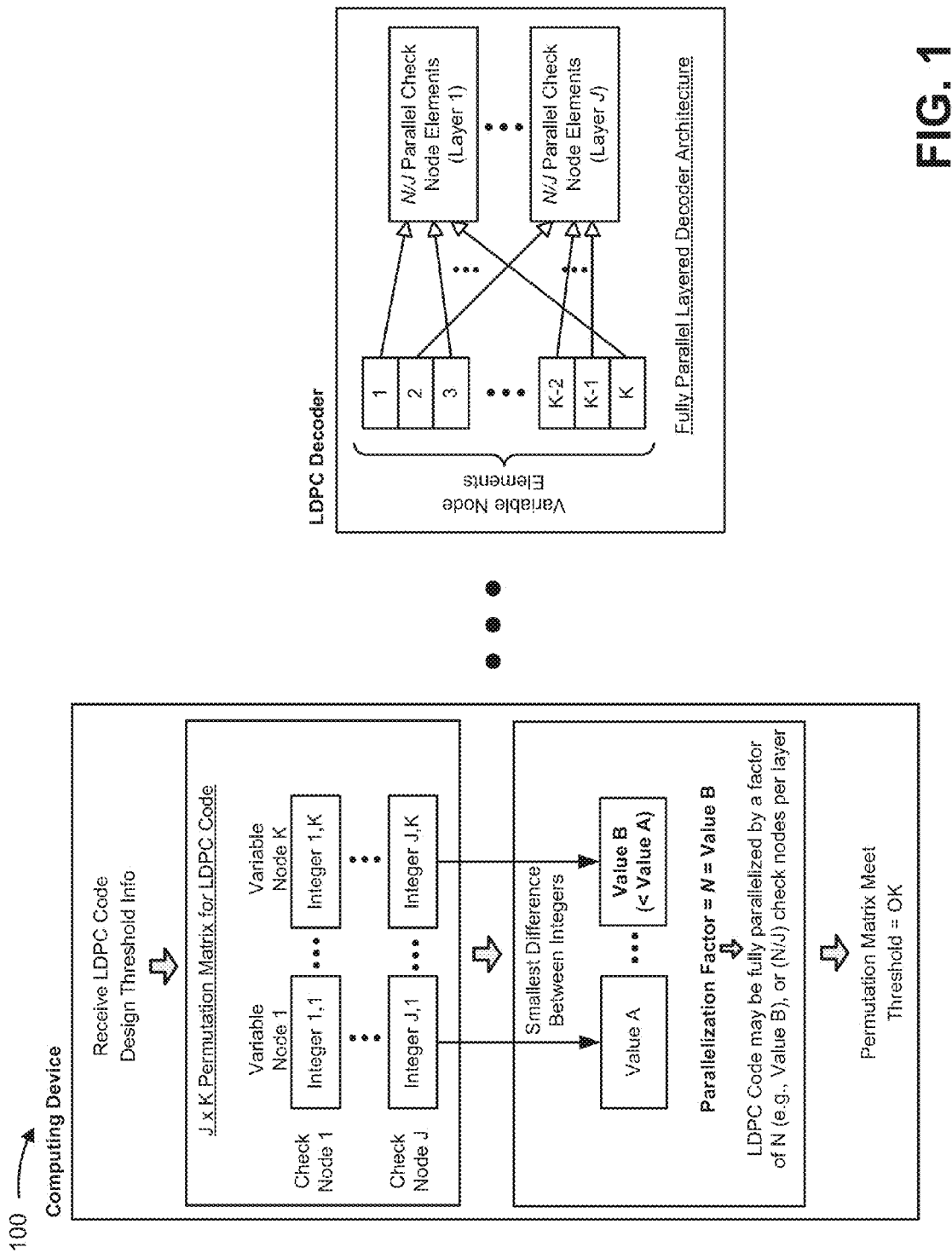
FIG. 1 is a diagram of an overview of an example implementation described herein.

FIG. 1 is a diagram of an overview of an example implementation 100 described herein. For the purposes of example implementation 100, assume that a user (e.g., an LDPC code designer) wishes to design (e.g., via a computing device that hosts LDPC code design software) an LDPC code such that LDPC coded data, coded using the LDPC code and decoded by an LDPC decoder, achieves a particular design threshold (e.g., a minimum amount of throughput).

As shown, the computing device may receive (e.g., based on user input) information associated with the design threshold. As further shown, the computing device may determine (e.g., based on user input, based on information determined by the LDPC code design software, etc.) a permutation matrix, associated with the LDPC code, that includes a group of J rows (e.g., each row of the group of J rows corresponding to check node element 1 through check node element J) and a group of K columns (e.g., each column of the group of K columns corresponding to variable node element 1 through variable node element K). For the purposes of FIG. 1, assume that the LDPC code is designed such that the number of layers, associated with each iteration of decoding data coded using the LDPC code using a layered decoding technique, is equal to the number of check node elements identified in the permutation matrix (e.g., for a total of J layers).

As further shown in FIG. 1, each entry of the permutation matrix may include a numerical value (e.g., an integer value) that identifies a connection between a check node element and a variable node element at a given time. For example, check node element 1 may be connected to variable node element 1 stored at a memory storage location identified as Integer 1,1. In this way, a connection between each of the J check node elements and each of the K variable node elements may be identified in the permutation matrix associated with the LDPC code.

As shown, the computing device may compute, based on the permutation matrix, a parallelization factor (e.g., N) in order to determine whether the LDPC decoder, associated with decoding data coded using the LDPC code, may implement a fully parallel layered decoder architecture. As shown, the parallelization factor may be determined as being equal to the smallest difference (e.g., the smallest absolute difference, the smallest difference modulo Z) between any two values in a column of the permutation matrix. For the purposes of FIG. 1, assume that the smallest difference between any two values in any column of the permutation matrix is Value B, corresponding to the column associated with variable node element K. As such, the parallelization factor associated with the LDPC code is Value B (e.g., N=Value B). As such, the computing device may determine the LDPC code is fully layered parallelizable up to a factor of N (e.g., indicating that a quantity of N check node elements may be processed in parallel, with up to N/J check node elements per layer being processed in parallel).

As further shown, the computing device may determine (e.g., based on the parallelization factor, based on the design threshold, etc.) whether the LDPC code meets the design threshold. In other words, the computing device may determine whether the LDPC code is designed such that the design threshold may be satisfied while decoding data coded using the LDPC code. As shown, assume that the LDPC code (e.g., which is fully layered parallelizable up to N/J check node elements per layer) allows the LDPC decoder to achieve the design threshold. As also shown, based on the computing device determining that the LDPC code allows for the design threshold to be satisfied, the LDPC decoder may be configured to implement a fully parallel layered decoder architecture that includes J groups of N/J parallel check node elements that may access and update variable node elements, associated with each check node element, in parallel.

In this way, an LDPC code may be designed such that an LDPC decoder may implement a fully parallel layered decoder architecture that allows all layers, associated with decoding iterations of LDPC coded data, to be processed in parallel, and all check node elements, within each layer, to operate in parallel. This may allow the LDPC decoder to decode LDPC coded data in order to satisfy a design threshold, such as an amount of throughput (e.g., a low decoding latency), while requiring less memory storage per iteration, and with a simplified routing network (e.g., as compared to a traditional LDPC decoder architecture).

Figure 2:
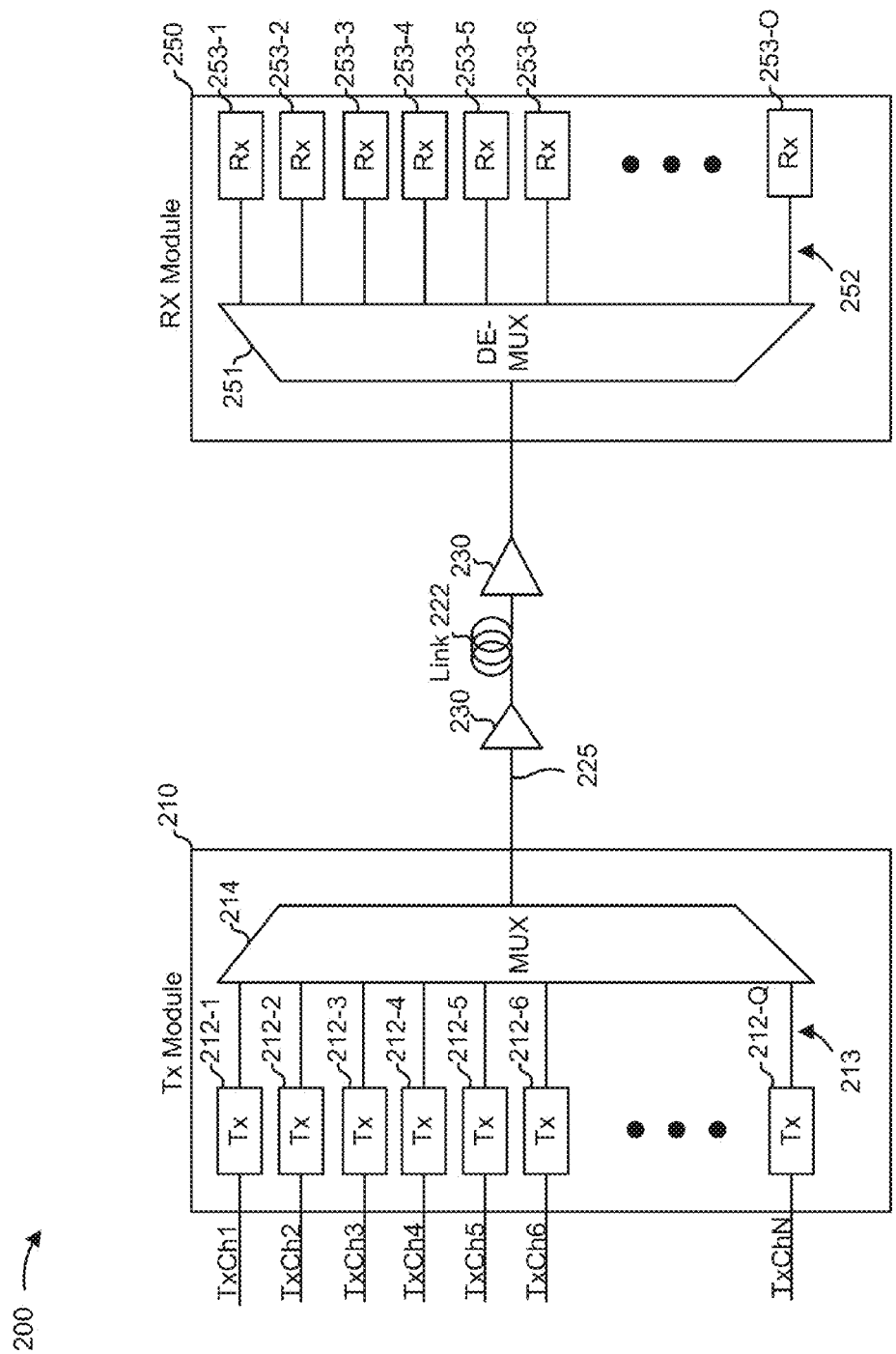
FIG. 2 is a diagram of an example network in which systems and/or methods, described herein, may be implemented.

FIG. 2 is a diagram of an example network 200 in which systems and/or methods described herein may be implemented. As shown in FIG. 2, a network may include transmitter module 210 (e.g., a Tx photonic integrated circuit (PIC)) and/or receiver module 250 (e.g., an Rx PIC). In some implementations, transmitter module 210 may be optically connected to receiver module 250 via link 222, and/or optical amplifiers 230. Link 222 may include one or more optical amplifiers 230 that amplify an optical signal as the optical signal is transmitted over link 222.

Transmitter module 210 may include a number of optical transmitters 212-1 through 212-Q (Q>1), waveguides 213, and/or optical multiplexer 214. Each optical transmitter 212 may receive a data channel (TxCh1 through TxChN), modulate the data channel with an optical signal, and transmit the data channel as an optical signal. In some implementations, transmitter module 210 may include 5, 10, 20, 50, 100, or some other number of optical transmitters 212. Each optical transmitter 212 may be tuned to use an optical carrier of a designated wavelength. It may be desirable that the grid of wavelengths emitted by optical transmitters 212 conform to a known standard, such as a standard published by the Telecommunication Standardization Sector (ITU-T).

Waveguides 213 may include optical links to transmit modulated outputs (referred to as "signal channels") of optical transmitters 212. In some implementations, each optical transmitter 212 may connect to one waveguide 213 or to multiple waveguides 213 to transmit signal channels of optical transmitters 212 to optical multiplexer 214. In some implementations, waveguides 213 may be made from a birefringent material and/or some other material.

Optical multiplexer 214 may include an arrayed waveguide grating (AWG) or some other multiplexing device. In some implementations, optical multiplexer 214 may combine multiple signal channels, associated with optical transmitters 212, into a wave division multiplexed (WDM) signal, such as optical signal 225.

As further shown in FIG. 2, receiver module 250 may include optical demultiplexer 251, waveguides 252, and/or optical receivers 253-1 through 253-O (O>1). In some implementations, optical demultiplexer 251 may include an AWG or some other device. Optical demultiplexer 251 may supply multiple signal channels based on a received WDM signal (e.g., optical signal 225). As shown in FIG. 2A, optical demultiplexer 251 may supply signal channels to optical receivers 253 via waveguides 252.

Waveguides 252 may include optical links to transmit outputs of optical demultiplexer 251 to optical receivers 253. In some implementations, each optical receiver 253 may receive outputs via a single waveguide 252 or via multiple waveguides 252. In some implementations, waveguides 252 may be made from a birefringent material and/or some other kind of material.

Optical receivers 253 may each operate to convert an input optical signal to an electrical signal that represents the transmitted data. In some implementations, optical receivers 253 may each include one or more photodetectors and/or related devices to receive respective input optical signals outputted by optical demultiplexer 251 and a local oscillator, convert the signals to a photocurrent, and provide a voltage output to function as an electrical signal representation of the original input signal.

The number of devices and networks shown in FIG. 2 is provided for explanatory purposes. In practice, there may be additional devices and/or networks, fewer devices and/or networks, different devices and/or networks, or differently arranged devices and/or networks than those shown in FIG. 2. Furthermore, two or more of the devices shown in FIG. 2 may be implemented within a single device, or a single device shown in FIG. 2 may be implemented as multiple, distributed devices. Additionally, one or more of the devices of network 200 may perform one or more functions described as being performed by another one or more of the devices of network 200.

Figure 3:
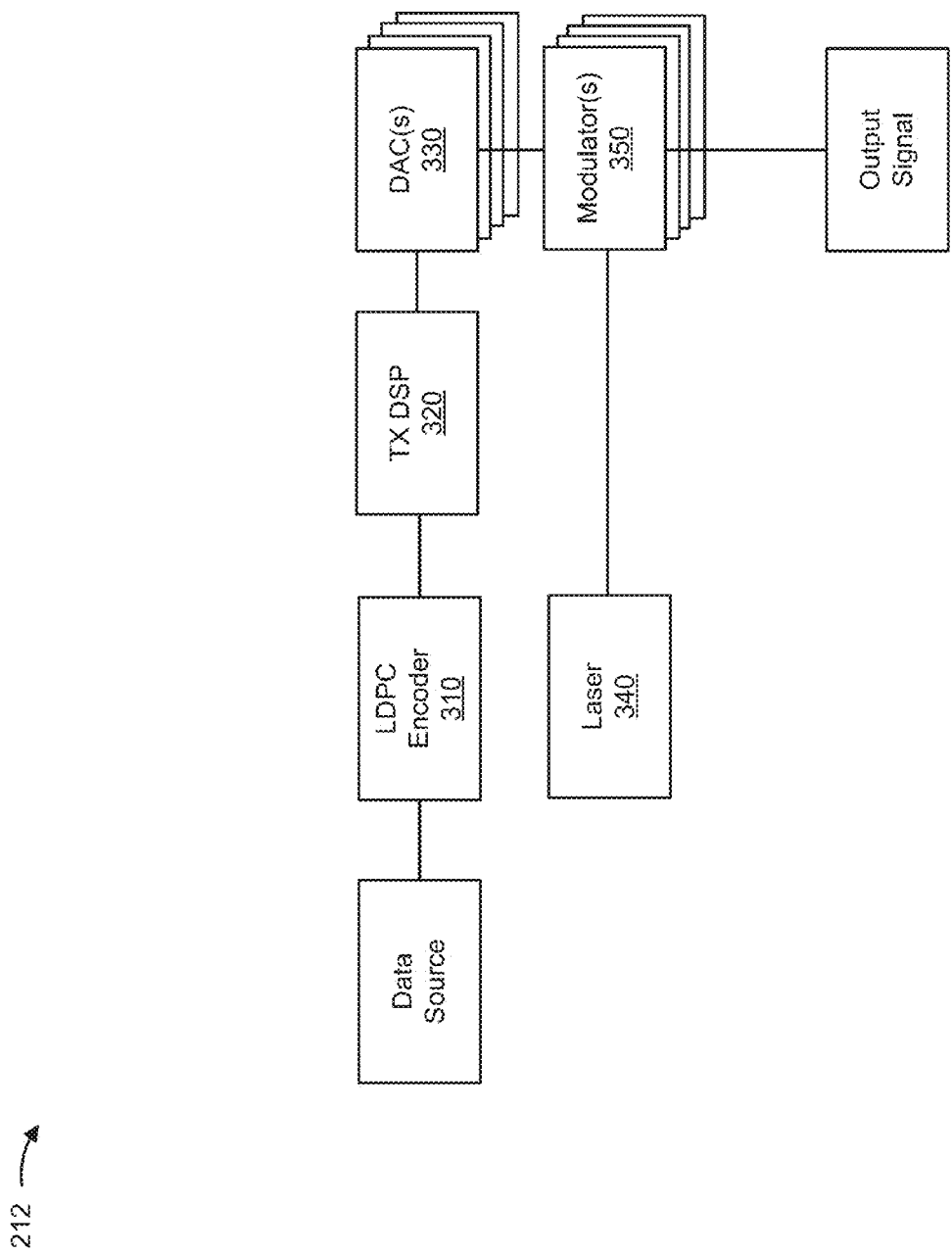
FIG. 3 is a diagram of example components of an optical transmitter shown in FIG. 2.

FIG. 3 is a diagram of example components of an optical transmitter 212 shown in network 200 of FIG. 2. As shown in FIG. 3, optical transmitter 212 may include an LDPC encoder 310, a Tx DSP 320, one or more digital-to-analog convertors (DACs) 330, a laser 340, and one or more modulators 350. In some implementations, LDPC encoder 310, Tx DSP 320, DACs 330, laser 340, and/or modulators 350 may be implemented on one or more integrated circuits, such as one or more PICs, one or more application specific integrated circuits (ASICs), or the like. In some implementations, components of multiple optical transmitters 212 may be implemented on a single integrated circuit, such as a single PIC, to form a super-channel transmitter.

LDPC encoder 310 may include a digital encoding device, or a collection of digital encoding devices. In some implementations, LDPC encoder 310 may receive input data, and may encode bits, associated with the input data, to control or reduce errors in the transmission of the bits. In some implementations, LDPC encoder 310 may encode the bits using an LDPC block code, and LDPC convolutional code, and/or some other LDPC code or technique, to create LDPC coded data. An LDPC decoder, included in optical receiver 253, may decode the LDPC coded data coded by LDPC encoder 310, as described below. In some implementations, LDPC encoder 310 may encode the bits using an LDPC code designed to allow the LDPC decoder to process each layer, associated with decoding LDPC coded data, and each check node element, included in each layer, in parallel, as described below. In some implementations, LDPC encoder 310 may be included in Tx DSP 320.

Tx DSP 320 may include a digital signal processor or a collection of digital signal processors. In some implementations, Tx DSP 320 may receive data from a data source (e.g., a signal received via a Tx channel), process the signal, and output digital signals having symbols that represent components of the signal (e.g., an in-phase x-pol component, a quadrature x-pol component, an in-phase y-pol component, and a quadrature y-pol component). In some implementations, Tx DSP 320 may include one or more other components, such as an interleaver component, a frame header insertion component, a symbol mapper component, and/or a pilot insertion component.

DAC 330 may include a signal converting device or a collection of signal converting devices. In some implementations, DAC 330 may receive respective digital signals from Tx DSP 320, may convert the received digital signals to analog signals, and may provide the analog signals to modulator 350. The analog signals may correspond to electrical signals (e.g., voltage signals) to drive modulator 350.

In some implementations, transmitter module 212 may include multiple DACs 330, where a particular DAC 330 may correspond to a particular polarization (e.g., an x-polarization, a y-polarization) of a signal and/or a particular component of a signal (e.g., an in-phase component, a quadrature component).

Laser 340 may include a semiconductor laser, such as a distributed feedback (DFB) laser, or some other type of laser. Laser 340 may provide an output optical light beam to modulator 350.

Modulator 350 may include a Mach-Zehnder modulator (MZM), such as a nested MZM, or another type of modulator. Modulator 350 may receive the optical light beam from laser 340 and the voltage signals from DAC 330, and may modulate the optical light beam, based on the voltage signals, to generate a multiple sub-carrier output signal, which may be provided to multiplexer 214.

In some implementations, optical transmitter 212 may include multiple modulators 350, which may be used to modulate signals of different polarizations. For example, an optical splitter may receive an optical light beam from laser 340, and may split the optical light beam into two branches: one for a first polarization (e.g., an x-polarization) and one for a second polarization (e.g., the y-polarization). The splitter may output one optical light beam to a first modulator 350, which may be used to modulate signals of the first polarization, and another optical light beam to a second modulator 350, which may be used to modulate signals of the second polarization. In some implementations, two DACs 330 may be associated with each polarization. In these implementations, two DACs 330 may supply voltage signals to the first modulator 350 (e.g., for an in-phase component of the x-polarization and a quadrature component of the x-polarization), and two DACs 330 may supply voltage signals to the second modulator 350 (e.g., for an in-phase component of the y-polarization and a quadrature component of the y-polarization). The outputs of modulators 350 may be combined back together using combiners (e.g., optical multiplexer 214) and polarization multiplexing.

The number and arrangement of components shown in FIG. 3 is provided as an example. In practice, optical transmitter 212 may include additional components, fewer components, different components, or differently arranged components than those shown in FIG. 3. For example, the quantity of DACs 330, lasers 340, and/or modulators 350 may be selected to implement an optical transmitter 212 that is capable of generating polarization diverse signals for transmission on an optical fiber, such as link 222. Additionally, or alternatively, a set of components shown in FIG. 3 may perform one or more functions described herein as being performed by another set of components shown in FIG. 3.

Figure 4:
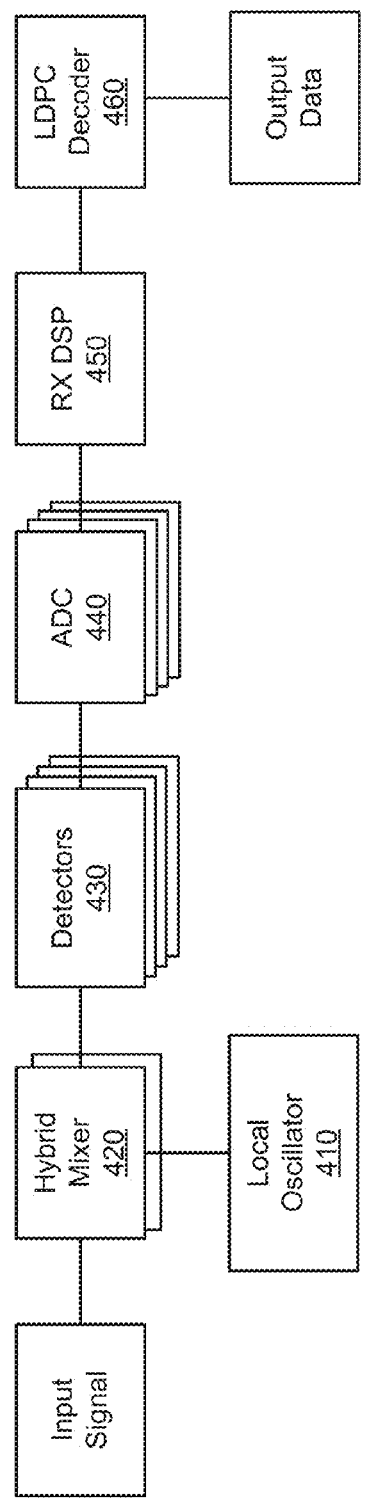
FIG. 4 is a diagram of example components of an optical receiver shown in FIG. 2.

FIG. 4 is a diagram of example components of an optical receiver 253 as shown in network 200 of FIG. 2. As shown in FIG. 4, optical receiver 253 may include a local oscillator 410, a hybrid mixer 420, detectors 430, analog-to-digital converters (ADCs) 440, an Rx DSP 450, and an LDPC decoder 460. In some implementations, local oscillator 410, hybrid mixer 420, and detectors 430 may be implemented on a single integrated circuit, such as a single PIC. In some implementations, ADC 440, Rx DSP 450, and/or LDPC decoder 460 may be implemented using an ASIC. In some other implementations, local oscillator 410, hybrid mixer 420, and/or detectors 430 may be implemented on one or more PICs.

Local oscillator 410 may include a laser device. In some implementations, local oscillator 410 may provide a reference signal to hybrid mixer 420. In some implementations, local oscillator 410 may include a single-sided laser to provide an optical signal to hybrid mixer 420. In some other implementations, local oscillator 410 may include a double-sided laser to provide multiple optical signals to multiple hybrid mixers 420. In some implementations, a phase, intensity, and/or amplitude of the reference signal may be compared to a phase, intensity, and/or amplitude of an input signal (e.g., a WDM signal supplied by optical demultiplexer 251 and corresponding to an output signal provided by transmitter module 210) to recover data carried by the input signal.

Hybrid mixer 420 may include one or more optical devices to receive an input signal (e.g., a WDM signal supplied by optical demultiplexer 251 and corresponding to an output signal provided by transmitter module 212). In some implementations, hybrid mixer 420 may receive a reference signal from local oscillator 410. In some implementations, hybrid mixer 420 may supply components associated with the input signal and the reference optical signal to detectors 430. For example, hybrid mixer 420 may supply an in-phase x-pol component, a quadrature x-pol component, an in-phase y-pol component, and a quadrature y-pol component. In some implementations, a first hybrid mixer 420 may provide the in-phase x-pol component and the quadrature x-pol component, and a second hybrid mixer 420 may provide the in-phase y-pol component and the quadrature y-pol component.

Detector 430 may include one or more photodetectors, such as a photodiode, to receive the output optical signal, from hybrid mixer 420, and convert the output optical signal to corresponding voltage signals. In some implementation, optical receiver 253 may include multiple detectors 430 for in-phase x-pol components, quadrature x-pol components, in-phase y-pol components, and quadrature y-pol components. In some implementations, detectors 430 may include one or more balanced pairs of photodetectors. For example, detectors 430 may include a first pair of photodetectors to receive an in-phase x-pol component, and a second pair of photodetectors to receive a quadrature x-pol component. Additionally, detectors 430 may include a third pair of photodetectors to receive an in-phase y-pol component, and a fourth pair of photodetectors to receive a quadrature y-pol component.

ADC 440 may include an analog-to-digital converter that converts the voltage signals from detector 430 to digital signals. ADC 440 may provide the digital signals to Rx DSP 450. In some implementations, optical receiver 253 may include four ADCs 440 or some other number of ADCs 440 (e.g., one ADC 440 for each electrical signal output by detectors 430).

Rx DSP 450 may include a digital signal processing device or a collection of digital signal processing devices. In some implementations, Rx DSP 450 may receive digital signals from ADCs 440 and may process the digital signals to form output data associated with the input signal received by hybrid mixer 420. In some implementations, Rx DSP 450 may include one or more other components, such as a carrier recovery component, a pilot phase estimate component, a decoder component, a frame header strip component, and/or a de-interleaver component.

LDPC decoder 460 may include a digital decoding device, or a collection of digital decoding devices. In some implementations, LDPC decoder 460 may receive grouped bits (e.g., LDPC coded data) from Rx DSP 450 (e.g., a de-interleaver component of Rx DSP 450) and decode the LDPC coded data using an LDPC block code, an LDPC convolutional code, and/or some other LDPC code or technique. In some implementations, LDPC decoder 460 may decode the LDPC code data to form recovered output data corresponding to input data provided to optical transmitter 212. In some implementations, LDPC decoder may implement a fully parallel layered decoder architecture, a partially parallel layered decoder architecture, and/or a modified parallel layered decoder architecture in order to decode LDPC coded data, as described below. In some implementations, LDPC decoder 460 may be included in Rx DSP 450.

In some implementations, LDPC decoder 460 may decode LDPC coded data based on a group of variable node elements (e.g., storage components that may be used to store LDPC coded data during the decoding process) and a group of check node elements (e.g., processing components that may be used to access and update LDPC coded data stored by the group of variable node elements) included in LDPC decoder 460. In some implementations, the quantity of variable node elements and/or the quantity of check node elements, included in LDPC decoder 460, may be based on a design of the LDPC code.

Figure 5:
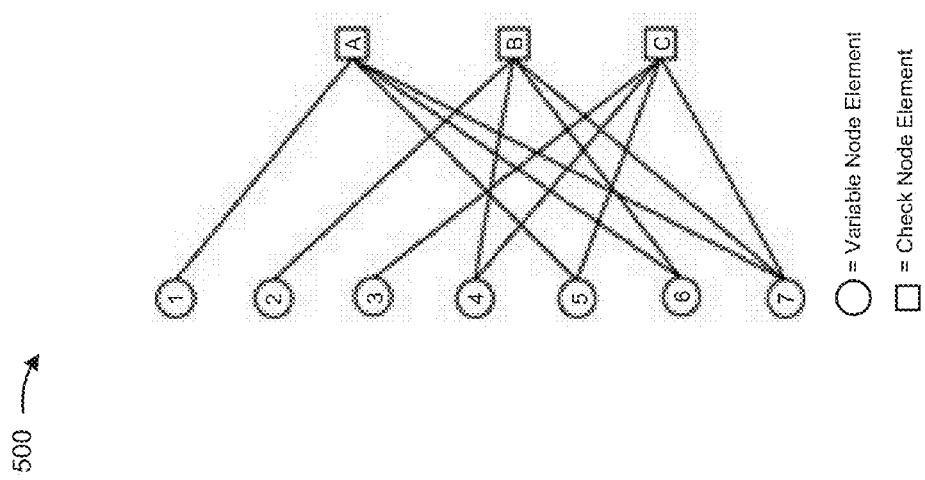
FIG. 5 is a diagram of an example of identifying connections between variable node elements, associated with a low-density parity-check (LDPC) code, and check node elements, associated with the LDPC code, based on a permutation matrix associated with the LDPC code.

An LDPC code is a linear block code with a sparse parity check matrix. The LDPC code may also be represented using a bipartite graph. In a graphical representation of the LDPC code, each column of the parity check matrix (e.g., matrix H) represents a variable node element, and each row of the parity check matrix represents a check node element. There is a connection between a check node i and a variable node j if the (i,j) entry included in the parity check matrix is 1 (i.e., $H_{(i,j)}=1$). For example, FIG. 5 shows a parity check matrix, and a corresponding graphical representation, for an LDPC code with seven variable node elements and three check node elements.

For practical applications, the parity check matrix of the LDPC code may be constructed based on a matrix of non-negative integers, called a permutation matrix. The permutation matrix, associated with an LDPC code, may include a J×K matrix P that includes numerical values (e.g., non-negative integer values) in the following form:

$$P = \begin{bmatrix} p_{1,1} & \cdots & p_{1,K} \\ \vdots & \ddots & \vdots \\ p_{J,1} & \cdots & p_{J,K} \end{bmatrix}$$

The parity check matrix is constructed by replacing each $p_{i,j}$, included in the permutation matrix, with an appropriate shifted identity matrix.

In the case of an LDPC block code, each $p_{i,j}$ is replaced by a zero-one matrix (e.g., $I_{p(i,j)}$) whose rows are obtained by cyclically shifting rows of an identity matrix to the left by $p_{i,j}$. As such, the parity check matrix may take the following form:

$$H_{BC} = \begin{bmatrix} I_{p_{1,1}} & \cdots & I_{p_{1,K}} \\ \vdots & \ddots & \vdots \\ I_{p_{J,1}} & \cdots & I_{p_{J,K}} \end{bmatrix}$$

The size of each zero-one matrix is Z×Z, where Z is an expansion factor of the LDPC block code that may be determined based on a desired performance and/or a desired latency associated with the LDPC block code. A polynomial representation of such a parity check matrix is given by:

$$H_{BC}(D) = \begin{bmatrix} D^{p_{1,1}} & \cdots & D^{p_{1,K}} \\ \vdots & \ddots & \vdots \\ D^{p_{J,1}} & \cdots & D^{p_{J,K}} \end{bmatrix} \text{modulo}(D^z + 1).$$

In the case of an LDPC convolutional code, each $p_{i,j}$ included in the permutation matrix determines a time delay and a connection between a check node element and a variable node element at a given time unit.

When implementing a layered decoding technique to decode LDPC coded data during an iteration of decoding LDPC coded data, LDPC decoder 460 may update a variable node element included in a first layer, and may update the variable node element again in a second layer (e.g., after the first layer). This process may be repeated for multiple layers. As such, LDPC decoder 460 may update the variable node element a total number of times equal to the quantity of layers during each iteration. In some implementations, LDPC decoder 460 may process multiple layers, associated with decoding LDPC coded data, in parallel, as described below.

Additionally, in some implementations, LDPC decoder 460 may process all check node elements, included in each layer, in parallel. For example, if $V_{t0} = [v_{t0}^1, v_{t0}^2, \ldots, v_{t0}^K]$ is a set of variable node elements received by LDPC decoder 460 at time $t_0$, then a first check node in a first layer (e.g., layer i) may process (e.g., update) the following set of variable node elements:

$$[v_{t0-p_{i,1}}^1, v_{t0-p_{i,2}}^2, v_{t0-p_{i,3}}^3, \ldots, v_{t0-p_{i,K}}^K]$$

Similarly, a second check node (e.g., one time unit later) in layer i may process a different set of variable node elements, identified as:

$$[v_{t0-1-p_{i,1}}^1, v_{t0-1-p_{i,2}}^2, v_{t0-1-p_{i,3}}^3, \ldots, v_{t0-1-p_{i,K}}^K]$$

As such, in processing the first L check node elements of layer i, the variable node elements being accessed and updated by the L check node elements are:

$$V_i^{1 \cdots L} = \begin{bmatrix} v_{t0-p_{i,1}}^1 & v_{t0-p_{i,2}}^2 & \cdots & v_{t0-p_{i,c}}^c \\ v_{t0-1-p_{i,1}}^1 & v_{t0-1-p_{i,2}}^2 & \cdots & v_{t0-1-p_{i,c}}^c \\ \vdots & \vdots & \cdots & \vdots \\ v_{t0-L-p_{i,1}}^1 & v_{t0-L-p_{i,2}}^2 & \cdots & v_{t0-L-p_{i,c}}^c \end{bmatrix}$$

As shown, each variable node element in $V_i^{1 \cdots L}$ is distinct, and may be updated in parallel (e.g., without any conflict between the L check node elements). In other words, LDPC decoder 460 may process all of the L check node elements, included in a layer, in parallel.

In some implementations, LDPC decoder 460 may implement (e.g., based on a parallelization factor associated with the LDPC code) a fully parallel layered decoder architecture that allows each layer associated with each decoding iteration, and each check node element, included in each layer, to be processed in parallel. For example, in order for LDPC decoder 460 to parallelize the processing of a total of J layers, and all L check node elements included in each layer of the J layers (e.g., for a total of L×J=N check node elements), the permutation matrix, associated with the LDPC code, may be designed such that a difference (e.g., the difference modulo Z in the case of an LDPC block code, the absolute smallest difference in the case of an LPDC convolutional code) between any two values included in a column of the permutation matrix is greater than the number of check node elements in each layer. In order to guarantee full parallelization, the permutation matrix must be designed such that this condition holds true for any two rows in any column of the permutation matrix. In such a case, the permutation matrix may be referred to as layered parallelizable with a parallelization factor of N.

For an LDPC block code, this condition may be represented as follows:

$$(p_{j,k} - p_{i,k})_Z > L, \ 0 \leq i,j \leq J, \ 0 \leq k \leq K.$$

The following example shows how satisfying the above condition results in no conflict in simultaneously processing all check node elements in each of J layers associated with an LDPC block code. For example, assume LDPC decoder 460 is to process two layers, layer i and layer j in parallel (e.g., corresponding to the ith and jth rows of H(D)). Further, assume that $V_i^{1 \cdots L}$ and $V_j^{1 \cdots L}$ represent sets of variable node elements to be accessed and updated by the first L check node elements of layer i and layer j, respectively:

$$V_i^{1 \cdots L} = \begin{bmatrix} v_{(t0-p_{i,1})Z}^1 & v_{(t0-p_{i,2})Z}^2 & \cdots & v_{(t0-p_{i,c})Z}^c \\ v_{(t0-1-p_{i,1})Z}^1 & v_{(t0-1-p_{i,2})Z}^2 & \cdots & v_{(t0-1-p_{i,c})Z}^c \\ \vdots & \vdots & \cdots & \vdots \\ v_{(t0-L-p_{i,1})Z}^1 & v_{(t0-L-p_{i,2})Z}^2 & \cdots & v_{(t0-L-p_{i,c})Z}^c \end{bmatrix}$$

$$V_j^{1 \cdots L} = \begin{bmatrix} v_{(t0-p_{j,1})Z}^1 & v_{(t0-p_{j,2})Z}^2 & \cdots & v_{(t0-p_{j,c})Z}^c \\ v_{(t0-1-p_{j,1})Z}^1 & v_{t(0-1-p_{j,2})Z}^2 & \cdots & v_{(t0-1-p_{j,c})Z}^c \\ \vdots & \vdots & \cdots & \vdots \\ v_{(t0-L-p_{j,1})Z}^1 & v_{(t0-L-p_{j,2})Z}^2 & \cdots & v_{(t0-L-p_{j,c})Z}^c \end{bmatrix}$$

In order to allow LDPC decoder 460 to process all of the first L check node elements in layer i and layer j in parallel, $V_i^{1 \cdots L}$ and $V_j^{1 \cdots L}$ must have no variable node element in common. A conflict may occur when both layer i and layer j need to access and update the same variable node element. For example, a conflict occurs where the variable node in column one and row $k_1$ of $V_i^{1 \cdots L}$ is the same as the variable node in column one and row $k_2$ of $V_j^{1 \cdots L}$ (e.g., when $(t_0-k_1-p_{i,1})_Z = (t_0-k_2-p_{j,1})_Z$). In other words, the conflict may occur when:

$$(p_{j,1} - p_{i,1})_Z = (k_2 - k_1)_Z$$

Assuming that $k_2 \geq k_1$, then $(p_{j,1} - p_{i,1})_Z = k_2 - k_1$, and since $0 \leq k_1, k_2 \leq L-1$, then $-L < (k_1 - k_2) < L$, and so $(p_{j,1} - p_{i,1})_Z < L$. In other words, to avoid any conflict in the first column of Layer i and Layer j:

$$(p_{j,1} - p_{i,1})_Z \geq L.$$

To avoid any conflict between layer i and layer j, the condition must be satisfied for all columns of $V_i^{1 \cdots L}$ and $V_j^{1 \cdots L}$:

$$(p_{j,1} - p_{i,1})_Z > L, \ 0 \leq k \leq c.$$

Finally, in order to process all layers in parallel, the permutation matrix needs to be designed such that there is no conflict between any two layers:

$$(p_{j,1} - p_{i,1})_Z > L, \ 0 \leq i,j \leq J, \ 0 \leq k \leq c.$$

When the LDPC block code is designed in conformance with the above condition, LDPC decoder 460 may fully layer parallelize processing of all layers, and all check node elements within each layer, associated with decoding LDPC coded data. Receiving a permutation matrix associated with an LDPC code, and computing a parallelization factor, associated with the permutation matrix, in order to determine whether LDPC decoder 460 may implement a fully parallel layered decoding architecture is described below with regard to FIG. 8.

Similarly, for an LDPC convolutional code, this condition may be represented as follows:

$$|p_{j,k} - p_{i,k}| > L, \ 0 \leq i,j \leq J, \ 0 \leq k \leq K.$$

The following example shows how satisfying the above condition results in no conflict in simultaneously processing all check node elements in each of the J layers associated with an LDPC convolutional code. For example, assume LDPC decoder 460 is to process two layers, layer i and layer j, in parallel. Further, assume that $V_i^{1 \cdots L}$ and $V_j^{1 \cdots L}$ represent sets of variable node elements to be accessed and updated by the first L check node elements of layer i and layer j, respectively:

$$V_i^{1 \cdots L} = \begin{bmatrix} v_{t0-p_{i,1}}^1 & v_{t0-p_{i,2}}^2 & \cdots & v_{t0-p_{i,c}}^c \\ v_{t0-1-p_{i,1}}^1 & v_{t0-1-p_{i,2}}^2 & \cdots & v_{t0-1-p_{i,c}}^c \\ \vdots & \vdots & \cdots & \vdots \\ v_{t0-L-p_{i,1}}^1 & v_{t0-L-p_{i,2}}^2 & \cdots & v_{t0-L-p_{i,c}}^c \end{bmatrix}$$

$$V_j^{1 \cdots L} = \begin{bmatrix} v_{t0-p_{j,1}}^1 & v_{t0-p_{j,2}}^2 & \cdots & v_{t0-p_{j,c}}^c \\ v_{t0-1-p_{j,1}}^1 & v_{t0-1-p_{j,2}}^2 & \cdots & v_{t0-1-p_{j,c}}^c \\ \vdots & \vdots & \cdots & \vdots \\ v_{t0-L-p_{j,1}}^1 & v_{t0-L-p_{j,2}}^2 & \cdots & v_{t0-L-p_{j,c}}^c \end{bmatrix}$$

In order to allow LDPC-CC decoder 460 to process all of the first L check node elements in layer i and layer j in parallel, $V_i^{1 \cdots L}$ and $V_j^{1 \cdots L}$ must have no variable node element in common. A conflict may occur when both layer i and layer j need to access and update the same variable node element. For example, a conflict occurs where the variable node in column one and row $k_1$ of $V_i^{1 \cdots L}$ is the same as the variable node in column one and row $k_2$ of $V_j^{1 \cdots L}$ (e.g., when $t_0-k_1-p_{i,1} = t_0-k_2-p_{j,1}$). In other words, the conflict may occur when:

$$p_{j,1} - p_{i,1} = (k_2 - k_1).$$

Assuming the $k_2 \geq k_1$, then $|p_{j,1} - p_{i,1}| = k_2 - k_1$, and since $0 \leq k_1, k_2 \leq L-1$, then $-L < (k_1 - k_2) < L$, and so $|p_{j,1} - p_{i,1}| < L$. In other words, to avoid any conflict in the first column of Layer i and Layer j:

$$|p_{j,1} - p_{i,1}| \geq L.$$

To avoid any conflict between layer i and layer j, the condition must be satisfied for all columns of $V_i^{1 \cdots L}$ and $V_j^{1 \cdots L}$:

$$|p_{j,k} - p_{i,k}| > L, \ 0 \leq k \leq c.$$

Finally, in order to process all layers in parallel, the delay matrix needs to be designed such that there is no conflict between any two layers:

$$|p_{j,k} - p_{i,k}| > L, \ 0 \leq i,j \leq J, \ 0 \leq k \leq c.$$

When the LDPC convolutional code is designed in conformance with the above condition, LDPC decoder 460 may fully layer parallelize processing of all layers, and all check node elements within each layer, associated with decoding LDPC coded data. Receiving a delay matrix associated with an LDPC code, and computing a parallelization factor, associated with the delay matrix, in order to determine whether LDPC decoder 460 may implement a fully parallel layered decoding architecture is to described below with regard to FIG. 8.

Figure 6:
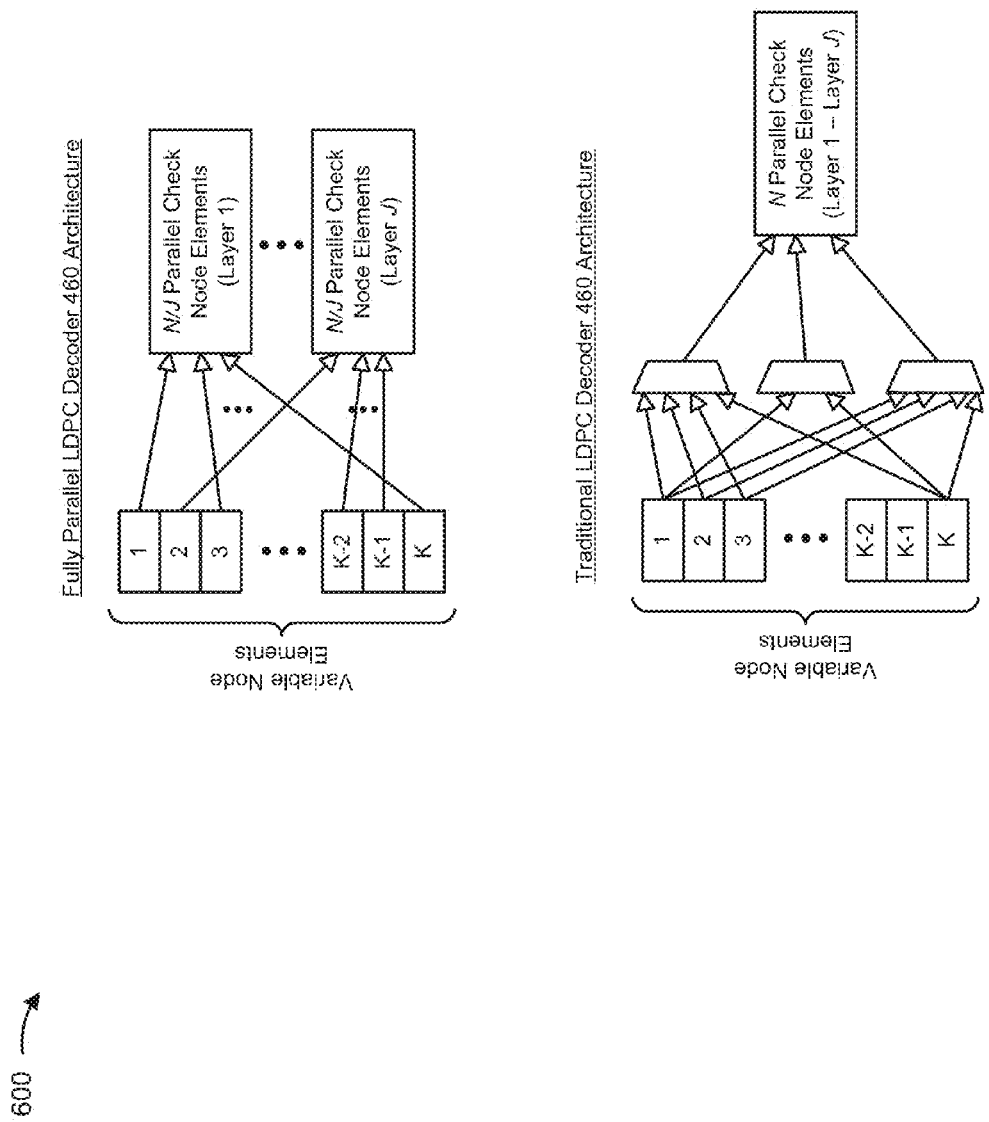
FIG. 6 includes a diagram of a fully parallel layered decoder architecture for an LDPC decoder, and a diagram of a traditional architecture for an LDPC decoder.

In some implementations, as shown in the upper portion of FIG. 6, LDPC decoder 460 may implement a fully parallel decoder architecture that includes up to a quantity of N/J processors assigned to each layer (e.g., rather than including N processors for all of the layers as in the traditional LDPC code architecture show in the lower portion of FIG. 6). In this way, routing, associated with connections between the check node elements and the variable node elements may be simplified (e.g., since a switching network, included in a traditional LDPC decoder, may not be necessary). Additionally, the parallel decoder architecture may require less memory storage (e.g., as compared to the traditional LDPC decoder architecture) since the extra storage memory storage required is N/J time units (e.g., which may be less than the memory storage required by the traditional LDPC decoder architecture by a factor of J).

In some implementations, LDPC decoder 460 may implement the fully parallel layered decoder architecture described above (e.g., such that all check node elements and all layers may be processed in parallel).

Additionally, or alternatively, LDPC decoder 460 may implement a partially parallel architecture based on the values included in the permutation matrix. For example, in some implementations, LDPC decoder 460 may implement a partially parallel architecture based on dividing the permutation matrix into two or more sub-matrices. This may occur when the condition, associated with implementing a fully parallel layered decoder architecture, is not present in the permutation matrix (e.g., when the permutation matrix is designed without applying the condition, when other LDPC code design constraints do not allow the condition to be present within the permutation matrix, etc.). In this example, the permutation matrix may be divided such that all layers and check node elements in first sub-matrix are processed in parallel, followed by all layers and check node elements in a second sub-matrix being process in parallel, and so on.

Additionally, or alternatively, LDPC decoder 460 may implement a modified architecture. For example, if the permutation matrix includes a small number of conflicts (e.g., a number of conflicts smaller than a threshold number of conflicts) that do not satisfy the condition described above, then LDPC decoder 460 may implement a modified architecture. The modified decoder architecture may result in similar advantages to those of a fully parallel layered decoder architecture, with a small loss in decoding performance. For example, assume that VX is a variable node element in common between a check node element in layer i and a check node element in layer j (e.g., in a traditional layered decoding algorithm, VX may be first accessed and updated by layer i, and then layer j may use the updated VX as an input). However, if LDPC decoder 460 implements a modified decoder architecture, then VX may be processed by layer i and layer j simultaneously, and a final update, associated with VX, may be a result of applying a combination function to updates associated with the two layers (e.g., an average of the two updates, a selection of the smaller of the two updates, a sum of the two updates, etc.). In the case of using summation as the combination function, the modified decoder architecture may be described as hybrid architecture (e.g., an architecture that employs both layered and non-layered decoding techniques). As such, when the condition described above is not present in the permutation matrix associated with the LDPC code, LDPC decoder 460 may implement a fully parallel layered decoder architecture that includes a slight modification that results in a small loss of decoding performance.

While FIG. 4 shows optical receiver 253 as including a particular quantity and arrangement of components, in some implementations, optical receiver 253 may include additional components, fewer components, different components, or differently arranged components.

Figure 7B:
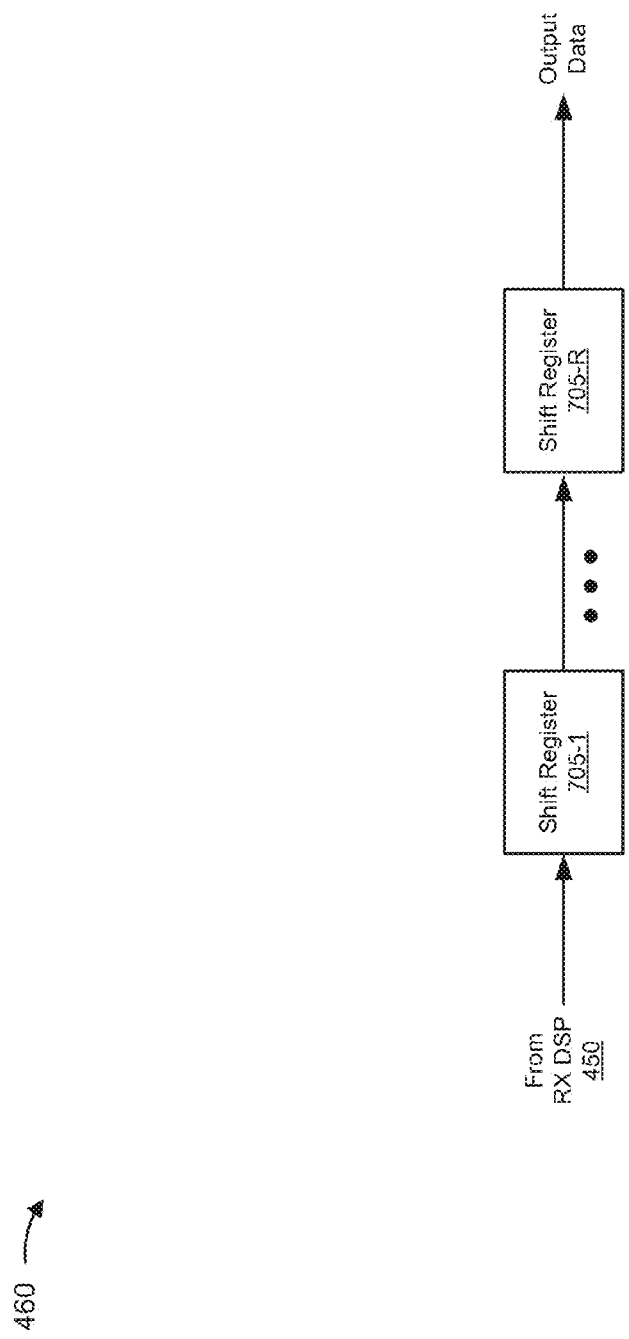

FIGS. 7A and 7B are diagrams of example components of LDPC decoder 460, shown in FIG. 4. FIG. 7A describes an LDPC decoder implemented using a group of shift register structures and a group of multiplexers to decode data coded using an LDPC block code. As shown in FIG. 7A, LDPC decoder 460, when implemented using a group of shift register structures and multiplexers to decode data coded using an LDPC block code, may include one or more shift register structures (e.g., shift register 705-1 through shift register 705-R).

Shift register 705 may include a structure associated with decoding LDPC coded data received by LDPC decoder 460. For example, shift register 705 may include a cascade of flip flops corresponding to a group of variable node elements and/or a group of check node elements associated with an iteration of decoding the LDPC coded data. In some implementations, shift register 705 may include a group of K shift register lanes, and each shift register lane may include multiple variable node elements (e.g., where K corresponds to the quantity of K data words, associated with the LDPC code, received by shift register 705 at a given time). Additionally, or alternatively, shift register 705 may include a group of shift register stages that allow shift register 705 to decode the K data words included in the LDPC coded data. Additionally, or alternatively, shift register 705 may include J check node elements, where J corresponds to a quantity of check node functions associated with decoding the LDPC coded data. In some implementations, LDPC decoder 460 may include multiple shift registers 705 (e.g., and each shift register 705 may perform one iteration of decoding the LDPC coded data received by LDPC decoder 460).

FIG. 7B describes an LDPC decoder implemented using a group of shift register structures to decode data coded using an LDPC convolutional code. As shown in FIG. 7B, LDPC decoder 460, when implemented using a group of shift register structures to decode data coded using an LDPC convolutional code, may include one or more shift registers 705 similar to those described above with regard to FIG. 7A. Additionally, or alternatively, LDPC decoder 460 may implement another and/or a different type of shift register structure to decode data coded using an LDPC convolutional code.

While FIGS. 7A and 7B shows LDPC decoder 460 as including a particular quantity and arrangement of shift registers, in some implementations, LDPC decoder 460 may include additional shift registers and/or additional other components, fewer shift registers, different shift registers and/or different other components, or differently arranged shift registers and/or other components.

Figure 8:
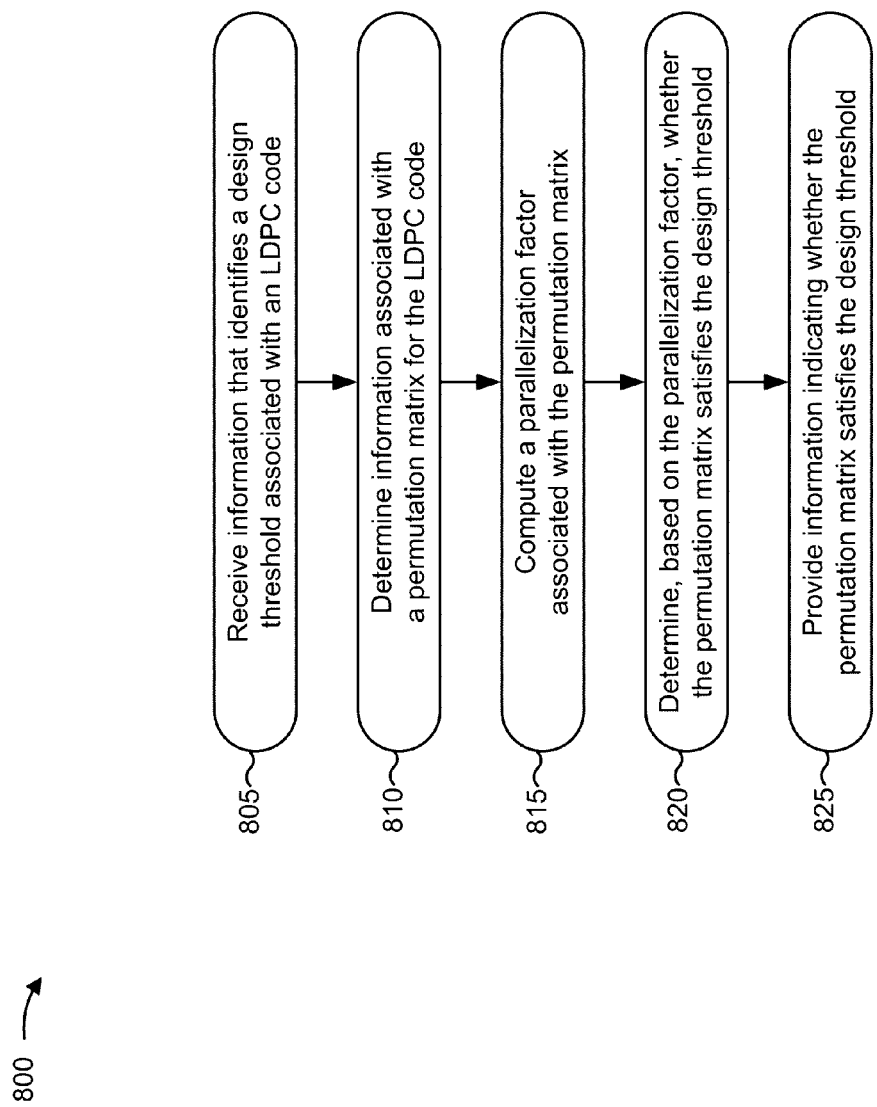
FIG. 8 is a flow chart of an example process for determining whether a permutation matrix, associated with an LDPC code, satisfies a design threshold associated with an LDPC code.

FIG. 8 is a flow chart of an example process for determining whether a permutation matrix, associated with an LDPC code, satisfies a design threshold associated with an LDPC code. In some implementations, one or more process blocks of FIG. 8 may be performed by a computing device, such as a laptop, a desktop, a workstation, a controller device, a server, and/or another type of computing device associated with designing an LDPC code. In some implementations, the computing device (e.g., one example of which will be described with respect to FIG. 13) may include one or more components, such as a processor and a memory. Additionally, or alternatively, the computing device may host design software associated with designing an LDPC code.

As shown in FIG. 8, process 800 may include receiving information that identifies a design threshold associated with an LDPC code (block 805). For example, the computing device may receive information that identifies a design threshold associated with an LDPC code. In some implementations, the computing device may receive the information that identifies the design threshold, associated with the LDPC code, when a user (e.g., a designer of the LDPC code) provides input associated with the design threshold. Additionally, or alternatively, the computing device may receive the information that identifies the design threshold when the computing device receives information associated with the design threshold from another device.

A design threshold, associated with an LDPC code, may include information that identifies a requirement associated with the LDPC code. For example, the design threshold may include a performance requirement that is to be satisfied when decoding data coded using the LDPC code (e.g., a minimum amount of throughput that is to be achieved when decoding the LDPC coded data, etc.), a hardware restriction associated with decoding data coded using the LDPC code (e.g., a maximum quantity of processors that be may decode the LDPC coded data, a maximum quantity of memory storage required to decode the LDPC coded data, etc.), or another type of design threshold. In some implementations, the computing device may determine multiple design thresholds associated with the LDPC code.

As further shown in FIG. 8, process 800 may include determining information associated with a permutation matrix for an LDPC code (block 810). For example, the computing device may determine information associated with a permutation matrix associated for an LDPC code. In some implementations, the computing device may determine the information associated with the permutation matrix for the LDPC code when a user (e.g., the designer of the LDPC code) provides input, associated with the permutation matrix, to the computing device. Additionally, or alternatively, the computing device may determine the information associated with the permutation matrix after the computing device receives the information that identifies the design threshold associated with the LDPC code.

As described above, a permutation matrix, associated with an LDPC code, may include a J×K matrix that includes numerical values (e.g., non-negative integer values), where each of the J rows corresponds to a check node element associated decoding the LDPC coded data at a given time unit, and where each of the K columns corresponds to a variable node element that stores LDPC coded data to be accessed and updated by a check node element at the given time. In some implementations, the computing device may determine the permutation matrix based on user input. For example, the user may provide, to the computing device, input associated with values included in the permutation matrix. Additionally, or alternatively, the computing device may determine the permutation matrix based on the design threshold. For example, the computing device may determine, based on a design threshold that identifies a maximum quantity of processors that be may decode the LDPC coded data, a quantity of rows to be included in the permutation matrix.

As further shown in FIG. 8, process 800 may include computing a parallelization factor associated with the permutation matrix (block 815). For example, the computing device may compute a parallelization factor associated with the permutation matrix. In some implementations, the computing device may compute the parallelization factor after the computing device determines the information associated with the permutation matrix. Additionally, or alternatively, the computing device may compute the parallelization factor after the computing device receives the information that identifies the design threshold associated with the LDPC code.

As described above, a parallelization factor, associated with an LDPC code, may include a value (e.g., N) that identifies a total quantity of check node elements (e.g., for the group of J layers) that may be processed (e.g., by LDPC decoder 460 configured based on the LDPC code) in parallel. As also described above, the parallelization factor, associated with the permutation matrix, may be computed as the smallest difference (e.g., the smallest difference modulo Z, the smallest absolute difference) between any two values included in a column of the permutation matrix.

In the case of an LDPC block code, the parallelization factor may be computed as the smallest difference modulo Z between any two values included in a column of the permutation matrix. For example, assume that the permutation matrix, associated with an LDPC block code, is a J×K matrix. In this example, the computing device may compute a quantity of K smallest column differences modulo Z between any two values in each of the K columns (e.g., a first smallest difference modulo Z between any two values in a first column, a second smallest difference modulo Z between any two values in a second column, etc.). The computing device may then identify the parallelization factor as being equal to an overall smallest difference modulo Z of the K smallest column differences modulo Z.

Similarly, in the case of an LDPC convolutional code, the parallelization factor may be computed as the smallest absolute difference between any two values included in a column of the permutation matrix. For example, assume that the permutation matrix, associated with an LDPC convolutional code, is a J×K matrix. In this example, the computing device may compute a quantity of K smallest absolute column differences between any two values in each of the K columns (e.g., a first smallest absolute difference between any two values in a first column, a second smallest absolute difference modulo Z between any two values in a second column, etc.). The computing device may then identify the parallelization factor as being equal to an overall smallest absolute difference Z of the K smallest absolute column differences.

In some implementations, the computing device may compute, based on the parallelization factor, a maximum quantity of check node elements per layer that may be processed in parallel based on the LDPC code. For example, when the quantity of layers, associated with decoding the LDPC, is equal to the number of check node elements identified in the permutation matrix (e.g., the number of rows), the computing device may compute the maximum quantity of check node elements, per layer, that may be processed in parallel as N/J, as described above.

In some implementations, the computing device may compute a parallelization factor associated with a fully parallel layered decoder architecture (e.g., the computing device may compute a parallelization factor based on the entire permutation matrix). Additionally, or alternatively, the computing device may compute a parallelization factor associated with a partially parallel layered decoding architecture. For example, the computing device may compute a first parallelization factor, associated with the entire permutation matrix, as being equal to zero (e.g., indicating that the LDPC code is not fully layered parallelizable). In this example, the computing device may divide (e.g., based on user input, based on analyzing the permutation matrix using the LDPC code design software, etc.) the permutation matrix into a first sub-matrix and a second sub-matrix, and may compute a second parallelization factor, associated with the first sub-matrix, and a third parallelization factor associated with the second sub-matrix. In some implementations, the computing device may divide the permutation matrix into two or more sub-matrices, and may determine a parallelization factor associated with each sub matrix. In some implementations, the computing device may also compute a maximum quantity of check node elements, per layer, that may be processed in parallel for each sub-matrix (e.g., based on a number of rows included in each sub-matrix and based on the parallelization factor corresponding to each sub-matrix).

As further shown in FIG. 8, process 800 may include determining, based on the parallelization factor, whether the permutation matrix satisfies the design threshold (block 820). For example, the computing device may determine, based on the parallelization factor, whether the permutation matrix satisfies the design threshold. In some implementations, the computing device may determine whether the permutation matrix satisfies the design threshold after the computing device computes the parallelization factor. Additionally, or alternatively, the computing device may determine whether the permutation matrix satisfies the design threshold when the computing device receives information (e.g., user input) indicating that the computing device is to determine whether the permutation matrix satisfies the design threshold.

In some implementations, the computing device may determine whether the permutation matrix satisfies the design threshold based on the parallelization factor. For example, assume that the computing device receives information indicating that data coded using an LDPC code is to achieve a throughput of 200 Gigibits per second (Gb/s), that the computing device determines information that identifies a permutation matrix that includes four rows and eight columns, and that the computing device computes a parallelization factor, associated with the permutation matrix, as being equal to 12 (e.g., indicating that 12 check node elements may be processed in parallel, with a maximum of 3 total check node elements, per layer, being processed in parallel). In this example, if the computing device determines, based on the parallelization factor, that the maximum throughput achievable by the LDPC code is less than 200 Gb/s, then the computing device may determine that the permutation matrix does not satisfy the design threshold.

As another example, assume that the computing device receives information indicating that data coded using an LDPC code is to achieve a throughput of 200 Gigibits per second (Gb/s), that the computing device determines information that identifies a permutation matrix that includes four rows and eight columns, and that the computing device computes a parallelization factor, associated with the permutation matrix, as being equal to 20 (e.g., indicating that 20 check node elements may be processed in parallel, with a maximum of 5 total check node elements, per layer, being processed in parallel). In this example, if the computing device determines, based on the parallelization factor, that the maximum throughput achievable by the LDPC code is greater than or equal to 200 Gb/s, then the computing device may determine that the permutation matrix does satisfy the design threshold.

In some implementations, the computing device may determine whether the permutation matrix satisfies the design threshold based on a parallelization factor associated with the entire permutation matrix. In other words, the computing device may determine whether LDPC decoder 460 may implement a fully parallel layered decoding architecture in order to meet the design threshold. Additionally, or alternatively, the computing device may determine whether the permutation matrix satisfies the design threshold based on a set of parallelization factors associated with two or more sub-matrices, as described above. In other words, the computing device may determine whether LDPC decoder 460 may implement a partially parallel layered decoding architecture in order to meet the design threshold (e.g., when the permutation matrix may be divided in to two or more sub-matrices such that each sub-matrix allows for full parallel processing). Additionally, or alternatively, the computing device may determine whether LDPC decoder 460 may implement a modified parallel layered decoding architecture in order to meet the design threshold.

As further shown in FIG. 8, process 800 may include providing information indicating whether the permutation matrix satisfies the design threshold (block 825). For example, the computing device may provide information indicating whether the permutation matrix satisfies the design threshold. In some implementations, the computing device may provide the information indicating whether the permutation matrix satisfies the design threshold after the computing device determines whether the permutation matrix satisfies the design threshold.

In some implementations, the computing device may determine that the permutation matrix does not satisfy the design threshold, and the computing device may provide, to the user (e.g., via a display screen associated with the computing device), information indicating that the permutation matrix does not satisfy the design threshold. The computing device may then determine another permutation matrix (e.g., the user may update, modify, alter, revise, etc. the permutation matrix and/or the design threshold), and the computing device may repeat the steps described above in order to determine whether the other permutation matrix satisfies the design threshold.

Alternatively, the computing device may determine that the permutation matrix does satisfy the design threshold, and the computing device may provide, to the user, information indicating that the permutation matrix does satisfy the design threshold. In other words, the computing device may notify the user that the LDPC code, associated with the permutation matrix, has been designed in accordance with the design threshold. In some implementations, computing device may determine that the permutation matrix does satisfy the design threshold, and the computing device may cause (e.g., by providing information associated with the permutation matrix) LDPC decoder 460 to be configured based on the permutation matrix (e.g., such that LDPC decoder 460 may decode data coded using the LDPC code associated with the permutation matrix).

Figure 9:
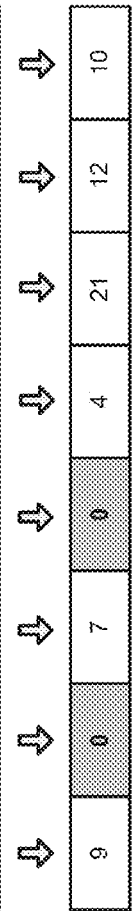
FIG. 9 is a diagram of an example permutation matrix, associated with an LDPC code, that does not allow an LDPC decoder to implement a fully parallel layered decoder architecture.
Figure 9:

FIG. 9 is a diagram of an example permutation matrix 900, associated with an LDPC code, that does not allow an LDPC decoder to implement a fully parallel layered decoder architecture. For the purposes of FIG. 9, assume that the computing device has determined information that identifies a (200,4,8) regular LDPC block code permutation matrix that includes a group of four rows (e.g., each row corresponding to one of a group of check node elements identified as C1 through C4) and a group of eight columns (e.g., each column corresponding to one of a group of variable node elements identified as V1 through V8). Further, assume that the number of layers is equal to the number of check node elements identified in the permutation matrix (e.g., J=4).

As shown in FIG. 9, the computing device may compute a parallelization factor (e.g., N) in order to determine whether the LDPC block code may be fully layer parallelized. As shown, the computing device may determine that the parallelization factor is equal to the smallest difference modulo 200 between any two values in a column of the permutation matrix. As shown, the smallest difference modulo 200 for each column is a follows: V1→136−127=9, V2→36−36=0, V3→119−112=7, V4→34−34=0, V5→19−15=4, V6→31−10=21, V7→152−140=12, and V8→169−159=10.

As shown, the computing device may determine that the smallest difference modulo 200 between any two values in a column is zero (e.g., in V2 and in V4). With respect to V2, the zero difference indicates that both C1 and C2 are configured to concurrently access and update the same V2 storage element at a given time. In other words, a layer associated with C1 may not be processed in parallel with a layer associated with C2. Similarly, with respect to V4, the zero value indicates that both C2 and C3 are configured to concurrently access and update the same V4 storage element at a given time. In other words, a layer associated with C2 may not be processed in parallel with a layer associated with C3. As such, the parallelization factor associated with the LDPC code is zero, indicating that the LDPC block code is not fully layered parallelizable (e.g., and that LDPC decoder 460 may not implement a fully parallel layered decoder architecture to decode data coded using the LDPC block code). The computing device may then determine, based on determining that the permutation matrix does not allow LDPC decoder 460 to implement a fully parallel layered decoding architecture, whether the permutation matrix satisfies a design threshold associated with the LDPC block code (e.g., whether a threshold amount of throughput may be satisfied when decoding data coded using an LDPC decoder that implements a traditional decoder architecture).

As indicated above, FIG. 9 is provided merely as an example. Other examples are possible and may differ from what was described with regard to FIG. 9.

Figure 10:
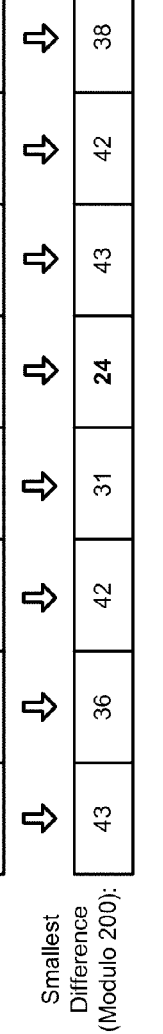
FIG. 10 is a diagram of an example permutation matrix, associated with an LDPC code, that allows an LDPC decoder to implement a fully parallel layered decoder architecture.

FIG. 10 is a diagram of an example permutation matrix 1000, associated with an LDPC code, that does allow an LDPC decoder to implement a fully parallel layered decoder architecture. For the purposes of FIG. 10, assume that the computing device has determined information that identifies a (200,4,8) regular LDPC block code permutation matrix that includes a group of four rows (e.g., each row corresponding to one of a group of check node elements identified as C1 through C4) and a group of eight columns (e.g., each column corresponding to one of a group of variable node elements identified as V1 through V8). Further, assume that the number of layers is equal to the number of check node elements identified in the permutation matrix (e.g., J=4).

As shown in FIG. 10, the computing device may compute a parallelization factor (e.g., N) in order to determine whether the LDPC block code may be fully layer parallelized. As shown, the computing device may determine that the parallelization factor is equal to the smallest difference modulo 200 between any two values in a column of the permutation matrix. As shown, the smallest difference modulo 200 for each column is a follows: V1→110−67=43, V2→162−126=36, V3→172−130=42, V4→101−70=31, V5→161−137=24, V6→110−67=43, V7→157−115=42, and V8→165−127=38.

As shown, the computing device may determine that the smallest difference modulo 200 between any two values in a column is 24 (e.g., in V5). As such, the parallelization factor, associated with the LDPC block code, indicates that the LDPC block code is fully layer parallelizable up to a factor of 24, meaning that up to 24 check node elements may be processed concurrently, with up to 6 check node elements being concurrently processed per layer (e.g., N/J=24/4=6).

The computing device may then determine, based on determining that the permutation matrix does allow LDPC decoder 460 to implement a fully parallel layered decoding architecture, whether the permutation matrix satisfies a design threshold associated with the LDPC block code (e.g., whether a threshold amount of throughput may be achieved when decoding data coded using an LDPC decoder that implements a fully parallel layered decoder architecture).

As indicated above, FIG. 10 is provided merely as an example. Other examples are possible and may differ from what was described with regard to FIG. 10.

Figure 11A:
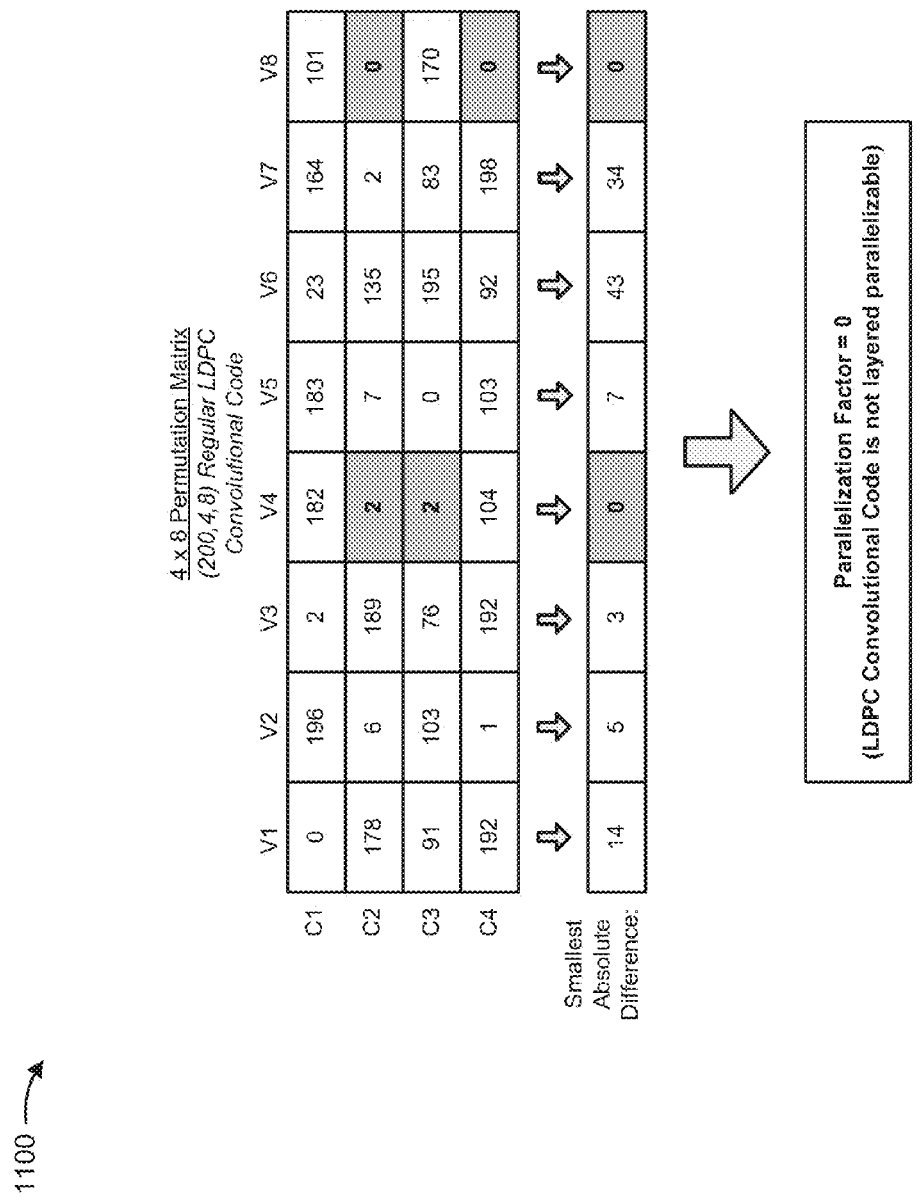

FIGS. 11A and 11B are diagrams of an example permutation matrix 1100, associated with an LDPC code, that does not allow an LDPC decoder to implement a fully layered decoding parallel architecture, but does allow the LDPC decoder to implement a partially parallel layered decoder architecture. For the purposes of FIGS. 11A and 11B, assume that the computing device has determined information that identifies a (200,4,8) regular LDPC convolutional code permutation matrix that includes a group of four rows (e.g., each row corresponding to one of a group of check node elements identified as C1 through C4) and a group of eight columns (e.g., each column corresponding to one of a group of variable node elements identified as V1 through V8). Further, assume that the number of layers is equal to the number of check node elements identified in the permutation matrix (e.g., J=4).

As shown in FIG. 11A, the computing device may compute a parallelization factor (e.g., N) in order to determine whether the LDPC convolutional code may be fully layer parallelized. As shown, the computing device may determine that the parallelization factor is equal to the smallest absolute difference between any two values in a column of the permutation matrix. As shown, the smallest absolute difference for each column is a follows: V1→192−178=14, V2→6−1=5, V3→192−189=3, V4→2−2=0, V5→7−0=7, V6→135−92=43, V7→198−164=34, and V8→0−0=0.

As shown, the computing device may determine that the smallest absolute difference between any two values in a column is zero (e.g., in V4 and in V8). With respect to V4, the zero difference indicates that both C2 and C3 are configured to concurrently access and update the same V4 storage element at a given time. In other words, a layer associated with C2 may not be processed in parallel with a layer associated with C3. Similarly, with respect to V8, the zero value indicates that both C2 and C4 are configured concurrently access and update the same V8 storage element at a given time. In other words, a layer associated with C2 may not be processed in parallel with a layer associated with C4. As such, the parallelization factor associated with the LDPC convolutional code is zero, indicating that the LDPC convolutional code is not fully layered parallelizable (e.g., and that LDPC decoder 460 may not implement a fully parallel layered decoder architecture to decode data coded using the LDPC convolutional code). However, the computing device may determine that LDPC decoder 460 may implement a partially parallel layered decoder architecture in this example.

As shown in FIG. 11B, the computing device may divide the permutation matrix into a first sub-matrix that includes the rows corresponding to C1 and C2, and a second sub-matrix that includes the rows corresponding to C3 and C4. The computing device may then determine a parallelization factor for each sub-matrix.

As shown, with respect to the first sub-matrix, the computing device may compute the parallelization factor may as 101 (e.g., 101−0=101, corresponding to the difference between C1 and C2 in the column corresponding to V8). As such, the parallelization factor, associated with the first sub-matrix of the LDPC convolutional code, indicates that up to 101 check node elements may be processed concurrently, with up to 50 check node elements being concurrently processed per layer (e.g., N/J=101/2≈50).

Similarly, with respect to the second sub-matrix, the computing device may compute the parallelization factor as 101 (e.g., 192−91=101, corresponding to the difference between C3 and C4 in the column corresponding to V1). As such, the parallelization factor, associated with the second sub-matrix of the LDPC convolutional code, indicates that up to 101 check node elements may be processed concurrently, with up to 50 check node elements being concurrently processed per layer (e.g., N/J=101/2≈50).

Therefore, the computing device may determine that LDPC decoder 460 may implement a partially parallel layered decoder architecture that allows up to 50 check node elements included in a layer corresponding to C1 and up to 50 check node elements in a layer corresponding to C2 to be processed in parallel, followed by up to 50 check node elements included in a layer corresponding to C3 and up to 50 check node elements in a layer corresponding to C4 to be processed in parallel.

The computing device may then determine, based on determining that the permutation matrix allows LDPC decoder 460 to implement a partially parallel layered decoding architecture, whether the permutation matrix satisfies a design threshold associated with the LDPC convolutional code (e.g., whether a threshold amount of throughput may be achieved when decoding data coded using an LDPC decoder that implements a partially parallel layered decoder architecture), as described above.

As indicated above, FIGS. 11A and 11B is provided merely as an example. Other examples are possible and may differ from what was described with regard to FIGS. 11A and 11B.

Figure 12A:
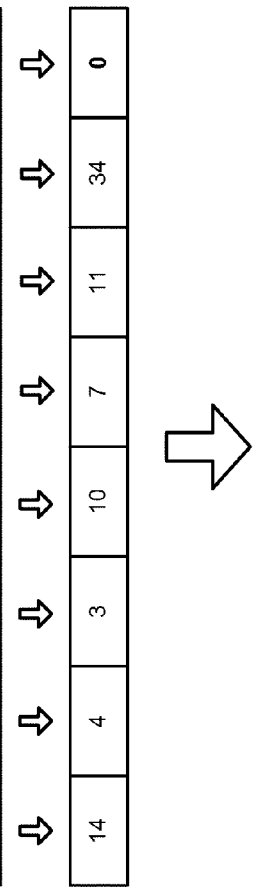
FIGS. 12A and 12B are diagrams of another example permutation matrix, associated with an LDPC code, that does not allow an LDPC decoder to implement a fully parallel layered decoder architecture, but does allow the LDPC decoder to implement a partially parallel layered decoder architecture.
Figure 12B:
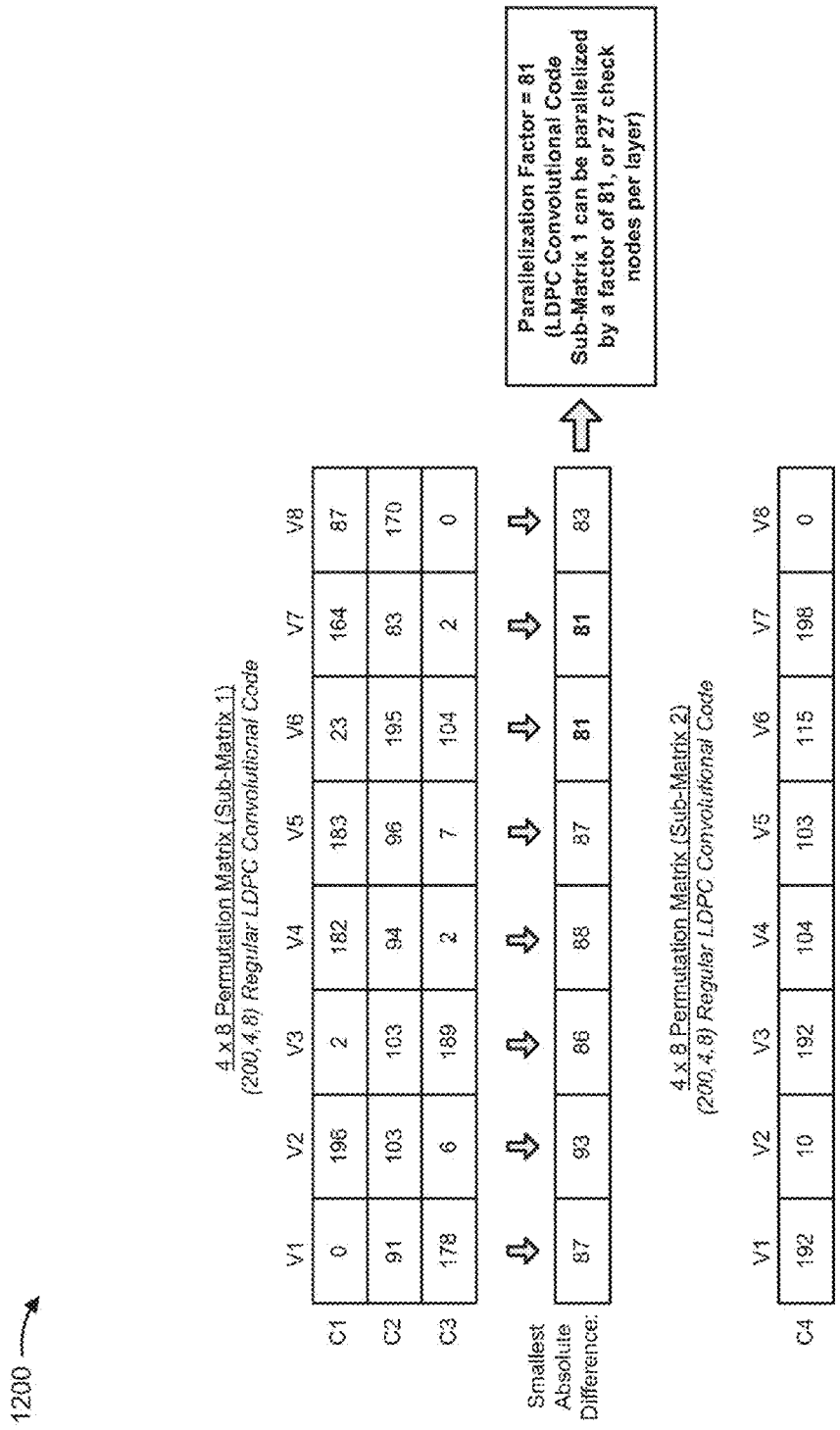

FIGS. 12A and 12B are diagrams of another example permutation matrix 1200, associated with an LDPC code, does not allow an LDPC decoder to implement a fully parallel layered decoder architecture, but does allow the LDPC decoder to implement a partially parallel layered decoder architecture. For the purposes of FIGS. 12A and 12B, assume that the computing device determines information that identifies a (200,4,8) regular LDPC convolutional code permutation matrix that includes a group of four rows (e.g., each row corresponding to one of a group of check node elements identified as C1 through C4) and a group of eight columns (e.g., each column corresponding to one of a group of variable node elements identified as V1 through V8). Further, assume that the number of layers is equal to the number of check node elements identified in the permutation matrix (e.g., J=4).

As shown in FIG. 12A, the computing device may compute a parallelization factor (e.g., N) in order to determine whether the LDPC convolutional code may be fully layer parallelized. As shown, the computing device may determine that the parallelization factor is equal to the smallest absolute difference between any two values in a column of the permutation matrix. As shown, the smallest absolute difference for each column is a follows: V1→192−178=14, V2→10−6=4, V3→192−189=3, V4→104−94=10, V5→103−96=7, V6→115−104=11, V7→198−164=34, and V8→0−0=0.

As shown, the computing device may determine that the smallest absolute difference between any two values in a column is zero (e.g., in V8). With respect to column V8, the zero value indicates that both C3 and C4 are configured to concurrently access and update the same V8 storage element at a given time. In other words, a layer associated with C3 may not be processed in parallel with a layer associated with C4. As such, the parallelization factor associated with the LDPC convolutional code is zero, indicating that the LDPC convolutional code is not fully layered parallelizable (e.g., and that LDPC decoder 460 may not implement a fully parallel layered decoder architecture to decode data coded using the LDPC convolutional code). However, the computing device may determine that LDPC decoder 460 may implement a partially parallel layered decoder architecture in this example.

As shown in FIG. 12B, the computing device may divide the permutation matrix into a first sub-matrix that includes the rows corresponding to C1, C2, and C3 and a second sub-matrix that includes the row corresponding to C4. The computing device may then compute a parallelization factor for the first sub-matrix (e.g., the second sub-matrix is not layer parallelized since the second sub-matrix is associated with only one layer).

As shown, with respect to the first sub-matrix, the computing device may compute the parallelization factor as 81 (e.g., in the column corresponding to V6, and in the column corresponding to V7). As such, the parallelization factor, associated with the first sub-matrix of the LDPC convolutional code, indicates that up to 81 check node elements may be processed concurrently, with up to 27 check node elements being concurrently processed per layer (e.g., N/J=81/3=27).

Therefore, the computing device may determine that LDPC decoder 460 may implement a partially parallel layered decoder architecture that allows up to 27 check node elements included in a layer corresponding to C1, up to 27 check node elements in a layer corresponding to C2, and up to 27 check node elements in a layer corresponding to C3 to be processed in parallel, followed by check node elements included in a layer corresponding to C4 being processed in parallel.

The computing device may then determine, based on determining that the permutation matrix allows LDPC decoder 460 to implement a partially parallel layered decoding architecture, whether the permutation matrix satisfies a design threshold associated with the LDPC convolutional code (e.g., whether a threshold amount of throughput may be achieved when decoding data coded using an LDPC decoder that implements a partially parallel layered decoder architecture), as described above.

As indicated above, FIGS. 12A and 12B is provided merely as an example. Other examples are possible and may differ from what was described with regard to FIGS. 12A and 12B.

Figure 13:
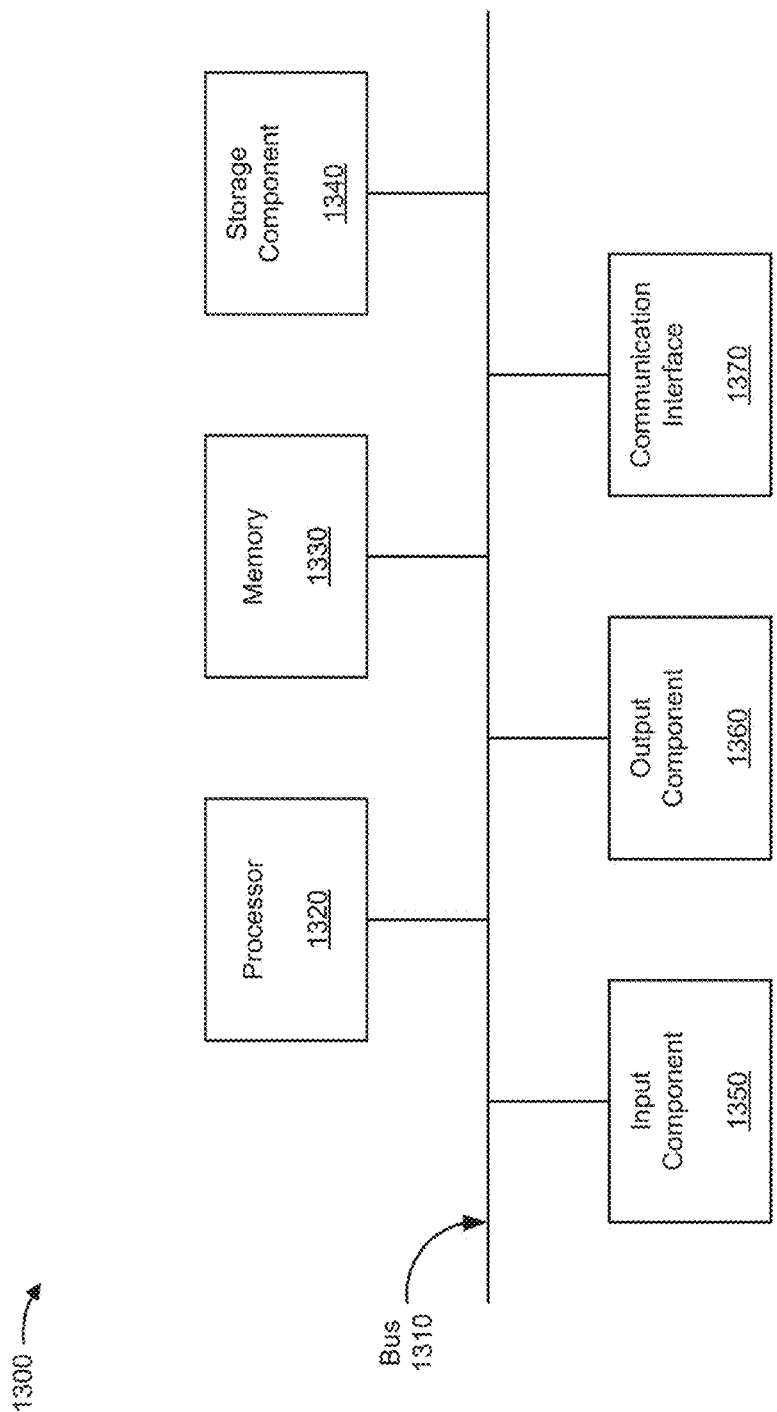
FIG. 13 is a diagram of an example of a computing device 1300 which may be used with the techniques described herein.

FIG. 13 is a diagram of an example of computing device 1300 which may be used with the techniques described here. Computing device 1300 may correspond to, for example, a device that is to receive, generate, test, process, and/or provide information associated with designing an LDPC code. For example, computing device 1300 may include a laptop, a desktop, a workstation, a server, and/or another type of computing device. In some implementations, computing device 1300 may include one or more components. For example, as shown in FIG. 13, computing device 1300 may include a bus 1310, a processor 1320, a memory 1330, a storage component 1340, an input component 1350, an output component 1360, and a communication interface 1370.

Bus 1310 may include a component that permits communication among the components of computing device 1300. Processor 1320 may include a processor (e.g., a central processing unit (CPU), a graphics processing unit (GPU), an accelerated processing unit (APU), etc.), a microprocessor, and/or any processing component (e.g., a field-programmable gate array (FPGA), an application-specific integrated circuit (ASIC), etc.) that interprets and/or executes instructions. Memory 1330 may include a random access memory (RAM), a read only memory (ROM), and/or another type of dynamic or static storage device (e.g., a flash memory, a magnetic memory, an optical memory, etc.) that stores information and/or instructions for use by processor 1320.

Storage component 1340 may store information and/or software related to the operation and use of computing device 1300. For example, storage component 1340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive.

Input component 1350 may include a component that permits computing device 1300 to receive information, such as via user input (e.g., a touch screen display, a keyboard, a keypad, a mouse, a button, a switch, a microphone, etc.). Additionally, or alternatively, input component 1350 may include a sensor for sensing information (e.g., a global positioning system (GPS) component, an accelerometer, a gyroscope, an actuator, etc.). Output component 1360 may include a component that provides output information from computing device 1300 (e.g., a display, a speaker, one or more light-emitting diodes (LEDs), etc.).

Communication interface 370 may include a transceiver-like component (e.g., a transceiver, a separate receiver and transmitter, etc.) that enables computing device 1300 to communicate with other devices, such as via a wired connection, a wireless connection, or a combination of wired and wireless connections. Communication interface 1370 may permit computing device 1300 to receive information from another device and/or provide information to another device. For example, communication interface 1370 may include an Ethernet interface, an optical interface, a coaxial interface, an infrared interface, a radio frequency (RF) interface, a universal serial bus (USB) interface, a Wi-Fi interface, a cellular network interface, or the like.

Computing device 1300 may perform one or more processes described herein. Computing device 1300 may perform these processes in response to processor 1320 executing software instructions stored by a computer-readable medium, such as memory 1330 and/or storage component 1340. A computer-readable medium is defined herein as a non-transitory memory device. A memory device includes memory space within a single physical storage device or memory space spread across multiple physical storage devices.

Software instructions may be read into memory 1330 and/or storage component 1340 from another computer-readable medium or from another device via communication interface 1370. When executed, software instructions stored in memory 1330 and/or storage component 1340 may cause processor 1320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 is provided as an example. In practice, computing device 1300 may include additional components, fewer components, different components, or differently arranged components than those shown in FIG. 3. Additionally, or alternatively, a set of components (e.g., one or more components) of computing device 1300 may perform one or more functions described as being performed by another set of components of computing device 1300.

Implementations described herein may allow an LDPC code to be designed such that an LDPC decoder may implement a fully parallel layered decoder architecture that allows all layers, associated with decoding iterations of LDPC coded data, to be processed in parallel, and all check node elements, within each layer, to operate in parallel. This may allow the LDPC decoder to decode LDPC coded data with high data throughput (e.g., a low decoding latency), while requiring less memory storage per iteration, and with a simplified routing network (e.g., as compared to a traditional LDPC decoder architecture).

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A computing device, comprising:
one or more processors configured to:
receive information that identifies a design threshold associated with a low-density parity-check (LDPC) code;
determine information associated with a permutation matrix for the LDPC code,
the permutation matrix including a group of rows,
each row, of the group of rows, corresponding to a check node element of a group of check node elements associated with the LDPC code,
the permutation matrix including a group of columns,
each column, of the group of columns, corresponding to a variable node element of a group of variable node elements associated with the LDPC code, and
the permutation matrix including a set of values,
each value, of the set of values, corresponding to a particular check node element, of the group of check node elements, and a particular variable node element of the group of variable node elements, and
each value, of the set of values, identifying a connection between the particular check node element and the particular variable node element;
compute a parallelization factor associated with the permutation matrix,
the parallelization factor being computed based on the set of values included in the permutation matrix;
determine, based on the parallelization factor, whether the permutation matrix satisfies the design threshold; and
provide information indicating whether the permutation matrix satisfies the design threshold,
where the one or more processors, when computing the parallelization factor, are configured to:
determine a group of column differences associated with the permutation matrix,
each column difference, of the group of column differences, corresponding to a column of the group of columns, and being equal to a smallest difference between any two values included in the column; and
identify the parallelization factor based on the group of column differences,
the parallelization factor being equal to a smallest value included in the group of column differences.

2. A computing device, comprising:
one or more processors configured to:
receive information that identifies a design threshold associated with a low-density parity-check (LDPC) code;
determine information associated with a permutation matrix for the LDPC code,
the permutation matrix including a group of rows,
each row, of the group of rows, corresponding to a check node element of a group of check node elements associated with the LDPC code,
the permutation matrix including a group of columns,
each column, of the group of columns, corresponding to a variable node element of a group of variable node elements associated with the LDPC code, and
the permutation matrix including a set of values,
each value, of the set of values, corresponding to a particular check node element, of the group of check node elements, and a particular variable node element of the group of variable node elements, and
each value, of the set of values, identifying a connection between the particular check node element and the particular variable node element;
compute a parallelization factor associated with the permutation matrix,
the parallelization factor being computed based on the set of values included in the permutation matrix;
determine, based on the parallelization factor, whether the permutation matrix satisfies the design threshold; and
provide information indicating whether the permutation matrix satisfies the design threshold,
where the one or more processors are further configured to:
determine, based on the parallelization factor, a maximum performance metric achievable for the LDPC code;
compare the maximum performance metric to the design threshold; and
where the one or more processors, when determining whether the permutation matrix satisfies the design threshold, are further to:
determine whether the permutation matrix satisfies the design threshold based on comparing the maximum performance metric to the design threshold.

3. A computing device, comprising:
one or more processors configured to:
receive information that identifies a design threshold associated with a low-density parity-check (LDPC) code;
determine information associated with a permutation matrix for the LDPC code,
the permutation matrix including a group of rows,
each row, of the group of rows, corresponding to a check node element of a group of check node elements associated with the LDPC code,
the permutation matrix including a group of columns,
each column, of the group of columns, corresponding to a variable node element of a group of variable node elements associated with the LDPC code, and
the permutation matrix including a set of values,
each value, of the set of values, corresponding to a particular check node element, of the group of check node elements, and a particular variable node element of the group of variable node elements, and
each value, of the set of values, identifying a connection between the particular check node element and the particular variable node element;
compute a parallelization factor associated with the permutation matrix,
the parallelization factor being computed based on the set of values included in the permutation matrix;

determine, based on the parallelization factor, whether the permutation matrix satisfies the design threshold; and provide information indicating whether the permutation matrix satisfies the design threshold, where the one or more processors are further configured to:

divide the permutation matrix into a first sub-matrix and a second sub-matrix, the first sub-matrix including a first sub-group of rows, of the group of rows, the group of columns, and a first sub-set of values of the set of values, the second sub-matrix including a second sub-group of rows, of the group of rows, the group of columns, and a second sub-set of values of the set of values;

compute, based on the first sub-set of values, a first parallelization factor associated with the first sub-matrix;

compute, based on the second sub-set of values, a second parallelization factor associated with the second sub-matrix; and determine, based on the first parallelization factor and the second parallelization factor, whether the permutation matrix satisfies the design threshold.

4. A computing device, comprising:

one or more processors configured to:

receive information that identifies a design threshold associated with a low-density parity-check (LDPC) code;

determine information associated with a permutation matrix for the LDPC code, the permutation matrix including a group of rows, each row, of the group of rows, corresponding to a check node element of a group of check node elements associated with the LDPC code, the permutation matrix including a group of columns, each column, of the group of columns, corresponding to a variable node element of a group of variable node elements associated with the LDPC code, and the permutation matrix including a set of values, each value, of the set of values, corresponding to a particular check node element, of the group of check node elements, and a particular variable node element of the group of variable node elements, and each value, of the set of values, identifying a connection between the particular check node element and the particular variable node element;

compute a parallelization factor associated with the permutation matrix, the parallelization factor being computed based on the set of values included in the permutation matrix;

determine, based on the parallelization factor, whether the permutation matrix satisfies the design threshold; and provide information indicating whether the permutation matrix satisfies the design threshold, where the one or more processors are further configured to:

determine, based on the parallelization factor, that an LDPC decoder, associated with decoding data coded using the LDPC code, cannot implement a fully parallel layered decoder architecture to decode the data coded using the LDPC code; and where the one or more processors, when determining whether the permutation matrix satisfies the design threshold, are further configured to:

determine whether the permutation matrix satisfies the design threshold based on determining that the LDPC decoder cannot implement the fully parallel layered decoder architecture.

5. The computing device of claim 4, where the one or more processors are further configured to:

determine, after determining that the LDPC decoder cannot implement the fully parallel layered decoding architecture, that the LDPC decoder can implement a partially parallel layered decoder architecture to decode the data coded using the LDPC code; and where the one or more processors, when determining whether the permutation matrix satisfies the design threshold, are further configured to:

determine whether the permutation matrix satisfies the design threshold based on determining that the LDPC decoder can implement the partially parallel layered decoder architecture.

6. The computing device of claim 4, where the one or more processors are further configured to:

determine, after determining that the LDPC decoder cannot implement the fully parallel layered decoding architecture, that the LDPC decoder can implement a modified fully parallel layered decoder architecture to decode the data coded using the LDPC code; and where the one or more processors, when determining whether the permutation matrix satisfies the design threshold, are further configured to:

determine whether the permutation matrix satisfies the design threshold based on determining that the LDPC decoder can implement the modified fully parallel layered decoder architecture.

7. A method, comprising:

determining, by a device, information that identifies a design threshold associated with a low-density parity-check (LDPC) code;

receiving, by the device, information associated with a permutation matrix associated with designing the LDPC code, the permutation matrix including a group of rows, each row, of the group of rows, corresponding to a processing element of a group of processing elements associated with the LDPC code, the permutation matrix including a group of columns, each column, of the group of columns, corresponding to a storage element of a group of storage elements associated with the LDPC code, and the permutation matrix including a set of values, each value, of the set of values, corresponding to a particular processing element, of the group of processing elements, and a particular storage element of the group of storage elements, and each value, of the set of values, identifying a connection between the particular processing element and the particular storage element;

determining, by the device, a parallelization factor associated with the permutation matrix, the parallelization factor being computed based on the set of values included in the permutation matrix;

identifying, by the device and based on the parallelization factor, whether the permutation matrix satisfies the design threshold; and providing, by the device, information indicating whether the permutation matrix satisfies the design threshold, where determining the parallelization factor comprises:

determining a group of column differences associated with the permutation matrix, each column difference, of the group of column differences, corresponding to a column of the group of columns, and being equal to a smallest difference between any two values included in the column; and identifying the parallelization factor based on the group of column differences, the parallelization factor being equal to a smallest value included in the group of column differences.

8. A method, comprising:

determining, by a device, information that identifies a design threshold associated with a low-density parity-check (LDPC) code;

receiving, by the device, information associated with a permutation matrix associated with designing the LDPC code, the permutation matrix including a group of rows, each row, of the group of rows, corresponding to a processing element of a group of processing elements associated with the LDPC code, the permutation matrix including a group of columns, each column, of the group of columns, corresponding to a storage element of a group of storage elements associated with the LDPC code, and the permutation matrix including a set of values, each value, of the set of values, corresponding to a particular processing element, of the group of processing elements, and a particular storage element of the group of storage elements, and each value, of the set of values, identifying a connection between the particular processing element and the particular storage element;

determining, by the device, a parallelization factor associated with the permutation matrix, the parallelization factor being computed based on the set of values included in the permutation matrix;

identifying, by the device and based on the parallelization factor, whether the permutation matrix satisfies the design threshold;

providing, by the device, information indicating whether the permutation matrix satisfies the design threshold;

determining, based on the parallelization factor, a maximum performance metric achievable for the LDPC code;

comparing the maximum performance metric to the design threshold; and where identifying whether the permutation matrix satisfies the design threshold further comprises:

identifying whether the permutation matrix satisfies the design threshold based on comparing the maximum performance metric to the design threshold.

9. A method, comprising:

determining, by a device, information that identifies a design threshold associated with a low-density parity-check (LDPC) code;

receiving, by the device, information associated with a permutation matrix associated with designing the LDPC code, the permutation matrix including a group of rows, each row, of the group of rows, corresponding to a processing element of a group of processing elements associated with the LDPC code, the permutation matrix including a group of columns, each column, of the group of columns, corresponding to a storage element of a group of storage elements associated with the LDPC code, and the permutation matrix including a set of values, each value, of the set of values, corresponding to a particular processing element, of the group of processing elements, and a particular storage element of the group of storage elements, and each value, of the set of values, identifying a connection between the particular processing element and the particular storage element;

determining, by the device, a parallelization factor associated with the permutation matrix, the parallelization factor being computed based on the set of values included in the permutation matrix;

identifying, by the device and based on the parallelization factor, whether the permutation matrix satisfies the design threshold;

providing, by the device, information indicating whether the permutation matrix satisfies the design threshold;

dividing the permutation matrix into a first sub-matrix and a second sub-matrix, the first sub-matrix including a first sub-group of rows, of the group of rows, the group of columns, and a first sub-set of values of the set of values, the second sub-matrix including a second sub-group of rows, of the group of rows, the group of columns, and a second sub-set of values of the set of values;

determining, based on the first sub-set of values, a first parallelization factor associated with the first sub-matrix;

determining, based on the second sub-set of values, a second parallelization factor associated with the second sub-matrix; and identifying, based on the first parallelization factor and the second parallelization factor, whether the permutation matrix satisfies the design threshold.

10. A method, comprising:

determining, by a device, information that identifies a design threshold associated with a low-density parity-check (LDPC) code;

receiving, by the device, information associated with a permutation matrix associated with designing the LDPC code, the permutation matrix including a group of rows, each row, of the group of rows, corresponding to a processing element of a group of processing elements associated with the LDPC code, the permutation matrix including a group of columns, each column, of the group of columns, corresponding to a storage element of a group of storage elements associated with the LDPC code, and the permutation matrix including a set of values, each value, of the set of values, corresponding to a particular processing element, of the group of processing elements, and a particular storage element of the group of storage elements, and each value, of the set of values, identifying a connection between the particular processing element and the particular storage element;

determining, by the device, a parallelization factor associated with the permutation matrix, the parallelization factor being computed based on the set of values included in the permutation matrix;

identifying, by the device and based on the parallelization factor, whether the permutation matrix satisfies the design threshold;

providing, by the device, information indicating whether the permutation matrix satisfies the design threshold;

determining, after determining the parallelization factor, that an LDPC decoder, associated with decoding data coded using the LDPC code, cannot implement a fully parallel layered decoder architecture to decode the data coded using the LDPC code; and where identifying whether the permutation matrix satisfies the design threshold further comprises:

identifying whether the permutation matrix satisfies the design threshold based on determining that the LDPC decoder cannot implement the fully parallel layered decoder architecture.

11. The method of claim 10, further comprising:

determining, after determining that the LDPC decoder cannot implement the fully parallel layered decoding architecture, that the LDPC decoder can implement a modified fully parallel layered decoder architecture to decode the data coded using the LDPC code; and where identifying whether the permutation matrix satisfies the design threshold further comprises:

identifying whether the permutation matrix satisfies the design threshold based on determining that the LDPC decoder can implement the modified fully parallel layered decoder architecture.

\* \* \* \* \*